(12) United States Patent
Byun et al.

(10) Patent No.: US 11,757,194 B2
(45) Date of Patent: Sep. 12, 2023

(54) ELECTRONIC DEVICE

(71) Applicants: Samsung Display Co., Ltd., Yongin-si (KR); UNIST(ULSAN NATIONAL INSTITUTE OF SCIENCE AND TECHNOLOGY), Ulsan (KR)

(72) Inventors: Gangil Byun, Busan (KR); Jae-Kyoung Kim, Hwaseong-si (KR); Kiseo Kim, Yongin-si (KR); Eunjin Sung, Yongin-si (KR); Jinmyeong Heo, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 60 days.

(21) Appl. No.: 17/496,790

(22) Filed: Oct. 8, 2021

(65) Prior Publication Data
US 2022/0209414 A1    Jun. 30, 2022

(30) Foreign Application Priority Data

Dec. 30, 2020    (KR) .................... 10-2020-0186921

(51) Int. Cl.
  *H01Q 1/24*    (2006.01)
  *H01Q 1/36*    (2006.01)
  (Continued)

(52) U.S. Cl.
CPC ........... *H01Q 9/0457* (2013.01); *H01Q 1/243* (2013.01); *H01Q 1/36* (2013.01); *H10K 59/00* (2023.02); *H10K 59/40* (2023.02)

(58) Field of Classification Search
CPC .......... H01Q 1/36; H01Q 1/243; H01Q 5/364; H01Q 5/371; H01Q 5/385; H01Q 9/0457;
(Continued)

(56) References Cited

U.S. PATENT DOCUMENTS 7,847,748 B1 *   12/2010   McKinley ............ H01Q 9/0435
                                                                343/756
10,381,750 B2     8/2019   Jung et al.
(Continued)

FOREIGN PATENT DOCUMENTS

KR    10-2019-0019802    2/2019

OTHER PUBLICATIONS

S. Ononchimeg, J.-H. Bang, B.-C. Ahn, and E.-J. Cha, "A New DualPolarized Gap-Fed Patch Antenna," Progress in Electromagnetics Research C, 2010, 79-87, vol. 14, Republic of Korea.
(Continued)

*Primary Examiner* — Thai Pham
(74) *Attorney, Agent, or Firm* — H.C. Park & Associates, PLC

(57) ABSTRACT

An electronic device includes a display panel on which a display area and a peripheral area around the display area are defined, a patch part disposed on the display panel and including a first side and a second side, a first transmission part disposed on the display panel, facing the first side of the patch part, spaced apart from the patch part, and coupled with the patch part, and a second transmission part disposed on the display panel, facing the second side of the patch part, spaced a plurality of openings part from the patch part, and coupled with the patch part.

20 Claims, 23 Drawing Sheets

(51) Int. Cl.
*H01Q 9/04* (2006.01)
*H10K 59/00* (2023.01)
*H10K 59/40* (2023.01)

(58) Field of Classification Search
CPC ...... H01Q 9/0435; H01Q 9/0407; H01Q 1/24; H01Q 9/04
See application file for complete search history.

(56) References Cited

U.S. PATENT DOCUMENTS

| | | |
|---|---|---|
| 10,608,344 B2 | 3/2020 | Paulotto et al. |
| 10,734,708 B2 | 8/2020 | Yong et al. |
| 2008/0316110 A1* | 12/2008 | Kanemura ........... H01Q 1/2208 343/700 MS |
| 2015/0255856 A1* | 9/2015 | Hong ................... H01Q 21/061 343/702 |
| 2019/0058264 A1* | 2/2019 | Jung .................... H01Q 9/0435 |
| 2020/0112098 A1 | 4/2020 | Sudo et al. |

OTHER PUBLICATIONS

Lei Zhu and Ke Wu, "Line-to-ring coupling circuit model and its parametric effects for optimized design of microstrip ring circuits and antennas," IEEE MTT-S International Microwave Symposium Digest, 1997, pp. 289-292 vol. 1, United States.

Kurup et al., "Compact microstrip-T coupled patch antenna for dual polarization and active antenna applications", Electronic Letters, Oct. 10, 2002, vol. 38, No. 21, IEE.

Maci et al., "Dual-Frequency Patch Antennas", Antennas and Propagation Magazine, Dec. 1997, vol. 39, No. 6, IEEE.

* cited by examiner

ELECTRONIC DEVICE

CROSS-REFERENCE TO RELATED APPLICATIONS

This application claims priority from and the benefit of Korean Patent Application No. 10-2020-0186921, filed on Dec. 30, 2020, which is hereby incorporated by reference for all purposes as if fully set forth herein.

BACKGROUND

Field

Embodiments of the invention relate generally to an electronic device capable of performing communication.

Discussion of the Background

An electronic device may include electronic modules. For example, the electronic device may be a portable terminal or a wearable device, and electronic modules may include an antenna module, a camera module, or a battery module. Due to thinning of the portable terminal and miniaturization of the wearable device, a space for mounting the electronic modules has gradually decreased. Also, as the electronic device is developed to have high functionality and high technical specifications, the number of the electronic modules contained in the electronic device has gradually increased.

The above information disclosed in this Background section is only for understanding of the background of the inventive concepts, and, therefore, it may contain information that does not constitute prior art.

SUMMARY

Devices constructed according to embodiments and implementations of those embodiments are capable of having improved operational characteristics while utilizing a smaller coupling space of an antenna to an electronic device.

The present disclosure provides an electronic device having improved antenna bandwidth.

The present disclosure also provides an electronic device capable of performing communication in various frequency bands.

Additional features of the inventive concepts will be set forth in the description which follows, and in part will be apparent from the description, or may be learned by practice of the inventive concepts.

An embodiment provides an electronic device including: a display panel on which a display area and a peripheral area around the display area are defined; a patch part disposed on the display panel and including a first side and a second side; a first transmission part disposed on the display panel, facing the first side of the patch part, spaced apart from the patch part, and coupled with the patch part; and a second transmission part disposed on the display panel, facing the second side of the patch part, spaced apart from the patch part, and coupled with the patch part.

The first transmission part may include a first transmission line and a first coupler extending from the first transmission line and facing the first side, and the second transmission part may include a second transmission line and a second coupler extending from the second transmission line and facing the second side.

The first transmission line and the second transmission line may be spaced apart from each other in a first direction, and each of the first transmission line and the second transmission line may extend in parallel to a second direction crossing the first direction.

The first coupler may include a first extension portion extending from the first transmission line in a first cross direction between the first direction and the second direction and a first facing portion extending in a second cross direction crossing the first cross direction, the second coupler may include a second extension portion extending from the second transmission line in the second cross direction and a second facing portion extending in the first cross direction, the first facing portion may face the first side of the patch part, and the second facing portion may face the second side of the patch part.

The first extension portion may be connected with a central area of the first facing portion, and the second extension portion may be connected with a central area of the second facing portion.

The first side of the patch part may be parallel to the second cross direction, and the second side of the patch part may be parallel to the first cross direction.

A length of the first side of the patch part may be greater than that of the first facing portion, and a length of the second side of the patch part may be greater than that of the second facing portion.

The first side of the patch part may have the same length as the second side of the patch part.

The first transmission part and the second transmission part may have shapes symmetric to each other.

The patch part may have a mesh structure in which a plurality of openings is defined.

The patch part may further include a third side facing the second side and connected with the first side and a fourth side facing the first side and connected with the third side and the second side, and the patch part may have a rectangular shape.

A first slot facing the third side and extending in a direction parallel to the third side and a second slot facing the fourth side and extending in a direction parallel to the fourth side may be defined in the patch part.

The electronic device may further include: a first radiation part disposed on the display panel, facing the third side of the patch part, spaced apart from the patch part, and coupled with the patch part; and a second radiation part disposed on the display panel, facing the fourth side of the patch part, spaced apart from the patch part, and coupled with the patch part.

The electronic device may further include: a first radiation part disposed on the display panel, facing the third side of the patch part, and connected with the third side of the patch part; and a second radiation part disposed on the display panel, facing the fourth side of the patch part, and connected with the fourth side of the patch part.

Each of the first transmission part and the second transmission part may have a mesh structure in which a plurality of openings is defined.

In an embodiment, an electronic device includes: a patch part; a first transmission part facing the patch part, spaced apart from the patch part, and coupled with the patch part; and a second transmission part facing the patch part, spaced apart from the patch part, and coupled with the patch part. Here, each of the first transmission part and the second transmission part includes a transmission line and a coupler facing the patch part, the coupler includes an extension portion extending from the transmission line and a facing portion extending in a direction crossing an extension direction of the extension portion and facing the patch part, and the extension portion is connected with a central area of the facing portion.

The patch part may include a first side facing the first transmission part, a second side facing the second transmission part and connected with the first side, a third side facing the second side and connected with the first side, and a fourth side facing the first side and connected with the third side and the second side, and the patch part may have a rectangular shape.

A first slot facing the third side and extending in a direction parallel to the third side and a second slot facing the fourth side and extending in a direction parallel to the fourth side may be defined in the patch part.

The electronic device may further include: a first radiation part facing the third side of the patch part, spaced apart from the patch part, and coupled with the patch part; and a second radiation part facing the fourth side of the patch part, spaced apart from the patch part, and coupled with the patch part.

The electronic device may further include: a first radiation part facing the third side of the patch part and connected with the third side of the patch part; and a second radiation part facing the fourth side of the patch part and connected with the fourth side of the patch part.

It is to be understood that both the foregoing general description and the following detailed description are illustrative and explanatory and are intended to provide further explanation of the invention as claimed.

BRIEF DESCRIPTION OF THE FIGURES

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
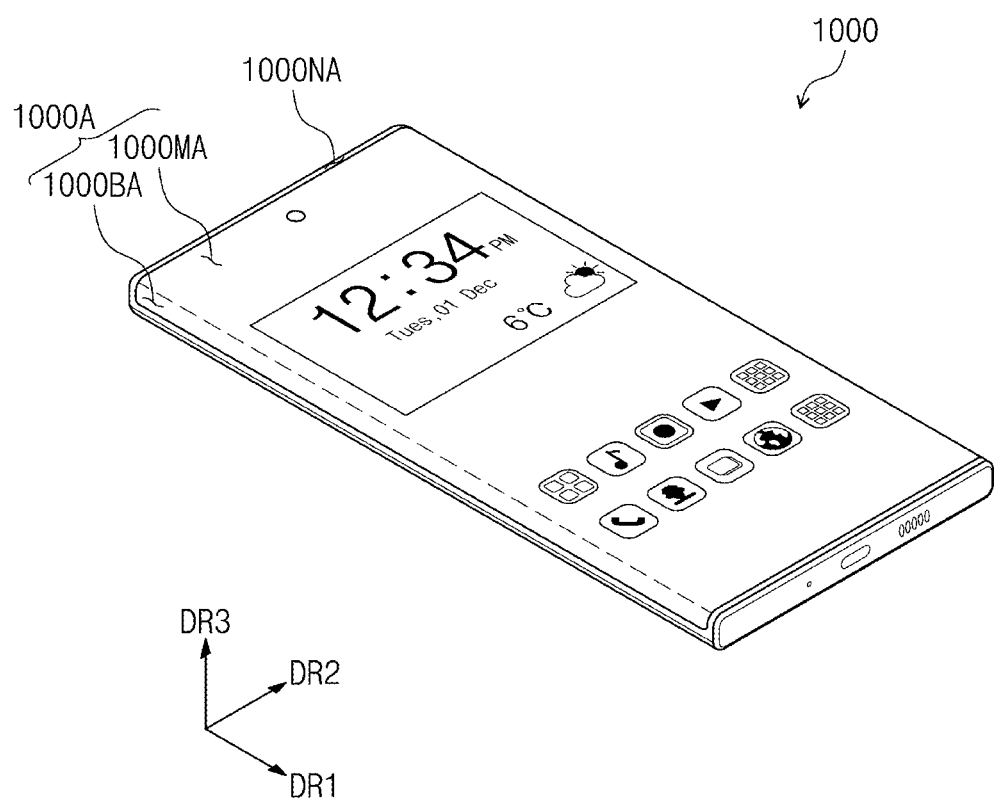
FIG. 1 is a perspective view of an electronic device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the illustrative term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of an electronic device according to an embodiment that is constructed according to principles of the invention.

Referring to FIG. 1, an electronic device 1000 may be activated by an electrical signal. Although the electronic device 1000 may be a mobile phone, a tablet computer, a navigation unit for a vehicle, a game console, or a wearable device as an example, the embodiment is not limited thereto. FIG. 1 illustrates a mobile phone as an example of the electronic device 1000.

In the electronic device 1000, a display area 1000A and a non-display area 1000NA may be defined. The non-display area 1000NA may be a peripheral area of the display is area 1000A.

The electronic device 1000 may display an image through the display area 1000A. The display area 1000A may include a first display surface 1000MA parallel to a surface defined by a first direction DR1 and a second direction DR2 and a second display surface 1000BA bent (i.e., not co-planar) from the first display surface 1000MA.

The second display surface 1000BA may be bent from one side of the first display surface 1000MA. Alternatively, the second display surface 1000BA may be provided as a plurality of second display surfaces. In this case, the second display surfaces 1000BA may be bent from at least two sides of the first display surface 1000MA. The display area 1000A may include one first display surface 1000MA and one or more and four or less second display surfaces 1000BA. However, the embodiment is not limited to the shape of the display area 1000A. For example, the display area 1000A may include only the first display surface 1000MA.

The electronic device 1000 may have a thickness direction parallel to a third direction DR3 crossing the first direction DR1 and the second direction DR2. Thus, a front surface (or a top surface) and a rear surface (or a bottom surface) of each of members constituting the electronic device 1000 may be defined with respect to the third direction DR3. A feature of being viewed on a plane may be defined as a feature of being viewed in the third direction DR3 of the electronic device 1000.

Figure 2:
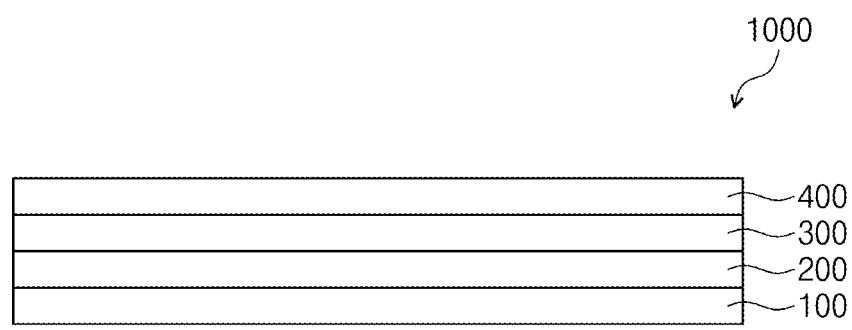
FIG. 2 is a schematic cross-sectional view of the electronic device according to an embodiment.
Figure 2:
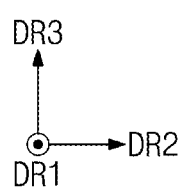

FIG. 2 is a schematic cross-sectional view of the electronic device according to an embodiment.

Referring to FIG. 2, the electronic device 1000 may include a display panel 100, an optical film 200, an antenna 300, and a window 400. In an embodiment, some of the above components may be omitted, or other components may be further added. An adhesive layer may be disposed between the above components as necessary. The adhesive layer may be an optically clear adhesive (OCA) or a pressure sensitive adhesive film. However, the embodiment is not limited thereto. Adhesive layers described below may also include the same material as described above, i.e., a typical adhesive.

The display panel 100 may include a display layer DPL (refer to FIG. 3) and a sensor layer ISL (refer to FIG. 3) disposed on the display layer DPL. The display layer DPL may be a component that substantially generates an image. The display layer DPL may be a light emitting display layer. For example, the display layer DPL may be an organic light emitting display layer, a quantum dot display layer, a micro-LED display layer, or a nano-LED display layer. The sensor layer ISL may be disposed on the display layer DPL. The sensor layer ISL may sense an external input applied from the outside. The sensor layer ISL may be an external sensor bonded to the display layer DPL or an integrated sensor provided consecutively in a process of manufacturing the display layer DPL.

The optical film 200 may reduce a reflectance of light incident from the outside. The optical film 200 may include a phase retarder and/or a polarizer. The optical film 200 may include at least a polarizing film. In this case, the optical film 200 may be bonded to the display panel 100 through an adhesive layer.

Alternately, the optical film 200 may include color filters. The color filters may have a predetermined arrangement. The arrangement of the color filters may be determined in consideration of emitted colors of pixels contained in the display layer DPL (refer to FIG. 3). Also, the optical film 200 may further include a black matrix disposed adjacent to the color filters. In this case, the adhesive layer between the optical film 200 and the display panel 100 may be omitted.

Alternately, the optical film 200 may include a destructive interference structure. For example, the destructive interference structure may include a first reflection layer and a second reflection layer, which are disposed on different layers. First reflected light and second reflected light, which are reflected from the first reflection layer and the second reflection layer, respectively, may be destructively interfered, and thus, a reflectance of external light may decrease. In this case, the adhesive layer between the optical film 200 and the display panel 100 may be omitted.

The antenna 300 may be disposed on the optical film 200. The antenna 300 may be a film-type antenna. The antenna 300 may transmit, receive, or transceive (i.e., transmit and receive) a wireless communication signal, e.g., a radio frequency signal. The antenna 300 may be referred to as a radio frequency device. The antenna 300 may include a plurality of patch parts (or a plurality of radiation parts), and the plurality of patch parts may transmit, receive, or transceive the same frequency band or different frequency bands. The antenna 300 may be bonded to the optical film 200 through an adhesive layer. A detailed description on the antenna 300 will be described later in more detail.

The window 400 may be disposed on the antenna 300. The window 400 may include an optically clear insulating material. For example, the window 400 may include glass or plastic. The window 400 may have a multi-layer structure or a single-layer structure. For example, the window 400 may include a plurality of plastic films coupled by an adhesive or a glass substrate and a plastic film, which are coupled by an adhesive.

Figure 3:
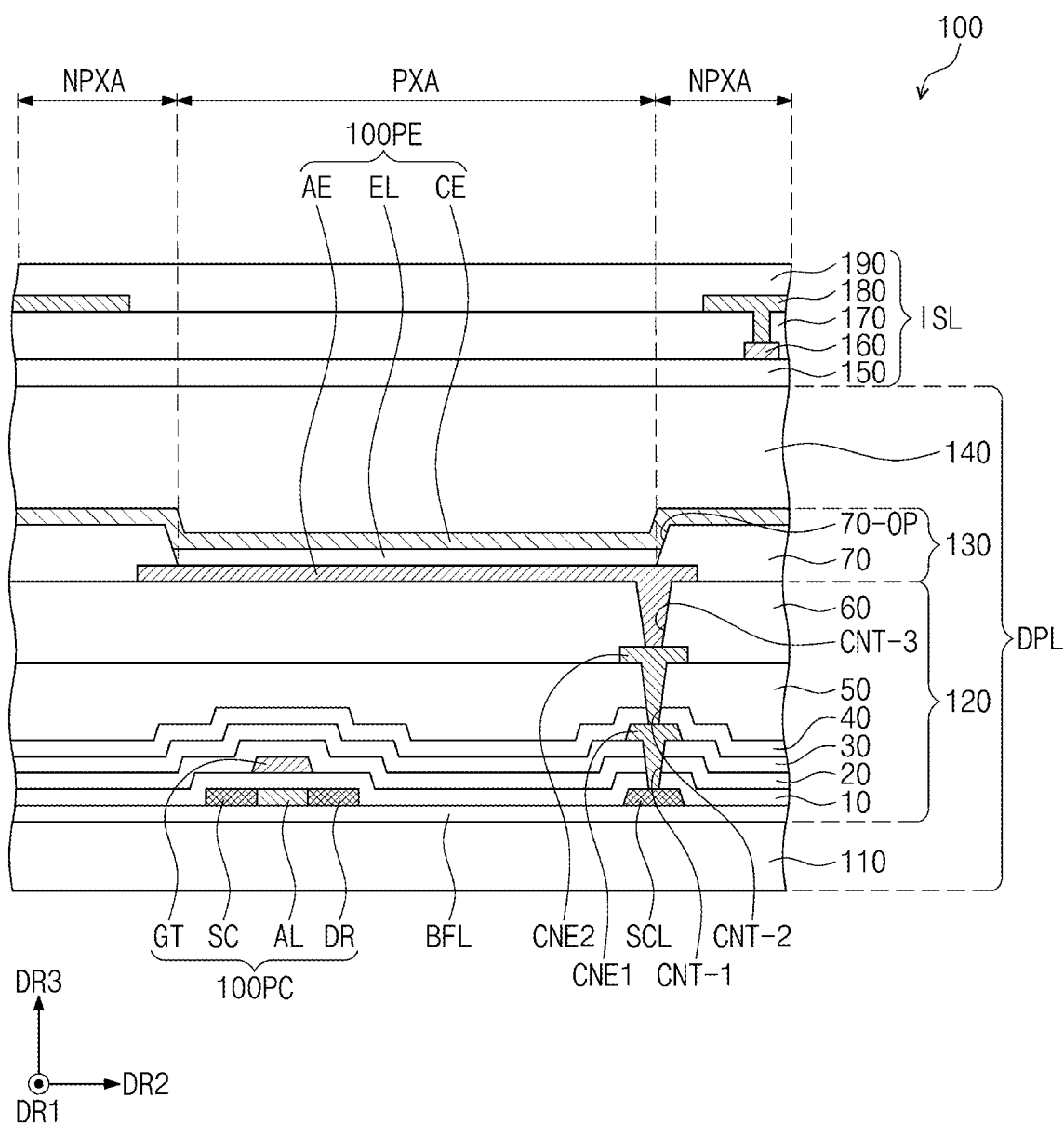
FIG. 3 is a cross-sectional view of a display panel according to an embodiment.

FIG. 3 is a cross-sectional view of the display panel according to an embodiment.

Referring to FIG. 3, the display layer DPL may include a base layer 110, a circuit layer 120, a light emitting device layer 130, and an encapsulation layer 140.

The base layer 110 may be a member providing a base surface on which the circuit layer 120 is disposed. The base layer 110 may include a glass substrate, a metal substrate, or a polymer substrate. However, the embodiment is not limited thereto. For example, the base layer 110 may be an inorganic layer, an organic layer, or a composite material layer.

The base layer 110 may have a multi-layer structure. For example, the base layer 110 may include a first synthetic resin layer, a silicon oxide ($SiO_x$) layer disposed on the first synthetic resin layer, an amorphous silicon (a-Si) layer disposed on the silicon oxide layer, and a second synthetic resin layer disposed on the amorphous silicon layer. Each of the silicon oxide layer and the amorphous silicon layer may be referred to as a base barrier layer.

Each of the first and second synthetic resin layers may include a polyimide-based resin. Also, each of the first and second synthetic resin layers may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin and a perylene-based resin. In the embodiments described herein, a term "~~based" resin represents a feature of including a functional group of "~~".

At least one inorganic layer is provided on a top surface of the base layer 110. The inorganic layer may include at least one of an aluminum oxide, a titanium oxide, a silicon oxide, a silicon nitride, a silicon oxynitride, a zirconium oxide, and a hafnium oxide. The inorganic layer may include multiple layers. The multi-layered inorganic layers may constitute a barrier layer and/or a buffer layer. In this embodiment, the display layer DPL includes a buffer layer BFL.

The buffer layer BFL may enhance a coupling force between the base layer 110 and a semiconductor pattern. The buffer layer BFL may include at least one of a silicon oxide, a silicon nitride, and a silicon oxynitride. For example, the buffer layer BFL may have a structure in which a silicon oxide layer and a silicon nitride layer are alternately laminated.

The semiconductor pattern may be disposed on the buffer layer BFL. The semiconductor pattern may include polysilicon. However, the embodiment is not limited thereto. For example, the semiconductor pattern may include amorphous silicon, low temperature polycrystalline silicon, or oxide semiconductor.

FIG. 3 merely illustrates a portion of the semiconductor pattern, and the semiconductor pattern may be further disposed on another area. The semiconductor pattern may be arranged over pixels based on a particular rule. The semiconductor pattern may have an electrical property that is different according to whether doped or not. The semiconductor pattern may include a first area having high conductivity and a second area having low conductivity. The first area may be doped with a n-type dopant or a p-type dopant. A p-type transistor may include a doped area that is doped with the p-type dopant, and a n-type transistor may include a doped area that is doped with the n-type dopant. The second area may be a non-doped area or an area that is doped with a lower concentration than the first area.

The first area may have conductivity greater than that of the second area and the first area substantially serve as an electrode or a signal line. The second area may substantially correspond to an active region (or a channel) of the transistor. In other words, one portion of the semiconductor pattern may be the active region of the transistor, another portion may be a source or a drain of the transistor, and another portion may be a connection electrode or a connection signal line.

Each of the pixels may have an equivalent circuit including seven transistors, one capacitor, and a light emitting device, and the equivalent circuit of the pixel may be deformed into various shapes. FIG. 3 illustrates one transistor 100PC and one light emitting device 100PE contained in the pixel as an example.

A source SC, an active region AL (or an active, an activation region), and a drain DR of the transistor 100PC may be provided from the semiconductor pattern. The source SC and the drain DR may extend from the active region AL in opposite directions on a cross-section. FIG. 3 illustrates a portion of a connection signal line SCL provided from the semiconductor pattern. Although not separately shown, the connection signal line SCL may be connected to the drain DR of the transistor 100PC on a plane.

A first insulation layer 10 may be disposed on the buffer layer BFL. The first insulation layer 10 may overlap a plurality of pixels in common and cover the semiconductor pattern. The first insulation layer 10 may be an inorganic layer and/or an organic layer and have a single-layer or multi-layer structure. The first insulation layer 10 may include at least one of an aluminum oxide, a titanium oxide, a silicon oxide, a silicon nitride, a silicon oxynitride, a zirconium oxide, and a hafnium oxide. In this embodiment, the first insulation layer 10 may be a single-layered silicon oxide layer. In addition to the first insulation layer 10, an insulation layer of the circuit layer 120, which will be described later, may be an inorganic layer and/or an organic layer and have a single-layer or multi-layer structure. Although the inorganic layer may include at least one of the above-described materials, the embodiment is not limited thereto.

A gate GT of the transistor 100PC is disposed on the first insulation layer 10. The gate GT may be a portion of a metal pattern. The gate GT overlaps the active region AL. The gate GT may function as a mask in a process of doping the semiconductor pattern.

A second insulation layer 20 may be disposed on the first insulation layer 10 to cover the gate GT. The second insulation layer 20 may overlap the pixels in common. The second insulation layer 20 may be an inorganic layer and/or an organic layer and have a single-layer or multi-layer structure. The second insulation layer 20 may include at least one of a silicon oxide, a silicon nitride, and a silicon oxynitride. In this embodiment, the second insulation layer 20 may have a multi-layer structure including a silicon oxide layer and a silicon nitride layer.

A third insulation layer 30 may be disposed on the second insulation layer 20. The third insulation layer 30 may have a single-layer or multi-layer structure. For example, the third insulation layer 30 may have a multi-layer structure including a silicon oxide layer and a silicon nitride layer.

A first connection electrode CNE1 may be disposed on the third insulation layer 30. The first connection electrode CNE1 may be connected to the connection signal line SCL through a contact hole CNT-1 passing through the first to third insulation layers 10 to 30.

A fourth insulation layer 40 may be disposed on the third insulation layer 30. The fourth insulation layer 40 may be a single-layered silicon oxide layer. A fifth insulation layer 50 may be disposed on the fourth insulation layer 40. The fifth insulation layer 50 may be an organic layer.

A second connection electrode CNE2 may be disposed on the fifth insulation layer 50. The second connection electrode CNE2 may be connected to the first connection electrode CNE1 through a contact hole CNT-2 passing through the fourth insulation layer 40 and the fifth insulation layer 50.

A sixth insulation layer 60 may be disposed on the fifth insulation layer 50 to cover the second connection electrode CNE2. The sixth insulation layer 60 may be an organic layer.

The light emitting device layer 130 may be disposed on the circuit layer 120. The light emitting device layer 130 may include the light emitting device 100PE. For example, the light emitting device layer 130 may include an organic light emitting material, a quantum dot, a quantum rod, a micro-LED, or a nano-LED. Hereinafter, although the light emitting device 100PE is an organic light emitting device as an example, the embodiment is not limited thereto.

The light emitting device 100PE may include a first electrode AE, a light emitting layer EL, and a second electrode CE.

The first electrode AE may be disposed on the sixth insulation layer 60. The first electrode AE may be connected to the second connection electrode CNE2 through a contact hole CNT-3 passing through the sixth insulation layer 60.

A pixel defining layer 70 may be disposed on the sixth insulation layer 60 to cover a portion of the first electrode AE. An opening 70-OP is defined in the pixel defining layer 70. The opening 70-OP of the pixel defining layer 70 exposes at least a portion of the first electrode AE.

The display area 1000A (refer to FIG. 1) may include a light emitting area PXA and a non-light emitting area NPXA disposed adjacent to the light emitting area PXA. The non-light emitting area NPXA may surround the light emitting area PXA. In this embodiment, the light emitting area PXA may be defined in correspondence to a partial area of the first electrode AE, which is exposed by the opening 70-OP.

The light emitting layer EL may be disposed on the first electrode AE. The light emitting layer EL may be disposed in an area corresponding to the opening 70-OP. That is, the light emitting layer EL may be separately provided in each of the pixels. When the light emitting layer EL is separately provided in each of the pixels, each of the light emitting layers EL may emit light having at least one color of blue, red, and green. However, the embodiment is not limited thereto. For example, the light emitting layer EL may be connected to the pixels and provided in common. In this case, the light emitting layer EL may provide blue light or white light.

The second electrode CE may be disposed on the light emitting layer EL. The second electrode CE may have an integrated shape and be disposed on the plurality of pixels in common.

A hole control layer may be disposed between the first electrode AE and the light emitting layer EL. The hole control layer may be disposed on the light emitting area PXA and the non-light emitting area NPXA in common. The hole control layer may include a hole transport layer and may further include a hole injection layer. An electron control layer may be disposed between the light emitting layer EL and the second electrode CE. The electron control layer may include an electron transport layer and may further include an electron injection layer. The hole control layer and the electron control layer may be provided in common to the plurality of pixels by using an open mask.

The encapsulation layer 140 may be disposed on the light emitting device layer 130. For example, the encapsulation layer 140 may include an inorganic layer, an organic layer and an inorganic layer, which are sequentially laminated.

However, the embodiment is not limited to the layers constituting the encapsulation layer 140.

The inorganic layers may protect the light emitting device layer 130 from moisture and oxygen, and the organic layer may protect the light emitting device layer 130 from foreign substances such as dust particles. The inorganic layers may include a silicon nitride layer, silicon oxynitride layer, a silicon oxide layer, a titanium oxide layer, or an aluminum oxide layer. The organic layer may include an acryl-based organic layer. However, the embodiment is not limited thereto.

The sensor layer ISL may include a base layer 150, a first conductive layer 160, a sensing insulation layer 170, a second conductive layer 180, and a cover insulation layer 190.

The base layer 150 may be an inorganic layer including one of a silicon nitride, a silicon oxynitride, and a silicon oxide. Alternatively, the base layer 150 may be an organic layer including an epoxy resin, an acrylic resin, or an imide-based resin. The base layer 150 may have a single-layer structure or a multi-layer structure laminated in the third direction DR3.

Each of the first conductive layer 160 and the second conductive layer 180 may have a single-layer structure or a multi-layer structure laminated in the third direction DR3.

The conductive layer having the single-layer structure may include a metal layer or a transparent conductive layer. The metal layer may include molybdenum, silver, titanium, copper, aluminum, or an alloy thereof. The transparent conductive layer may include a transparent conductive oxide such as an indium tin oxide (ITO), an indium zinc oxide (IZO), a zinc oxide (ZnO), and an indium zinc tin oxide (IZTO). Also, the transparent conductive layer may include a conductive polymer such as PEDOT, a metal nano-wire, or graphene.

The conductive layer having the multi-layer structure may include metal layers. The metal layers may have, e.g., a three-layer structure of titanium/aluminum/titanium. The conductive layer having the multi-layer structure may include at least one metal layer and at least one transparent conductive layer.

At least one of the sensing insulation layer 170 and the cover insulation layer 190 may include an inorganic layer. The inorganic layer may include at least one of an aluminum oxide, a titanium oxide, a silicon oxide, a silicon nitride, a silicon oxynitride, a zirconium oxide, and a hafnium oxide.

At least one of the sensing insulation layer 170 and the cover insulation layer 190 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

Figure 4:
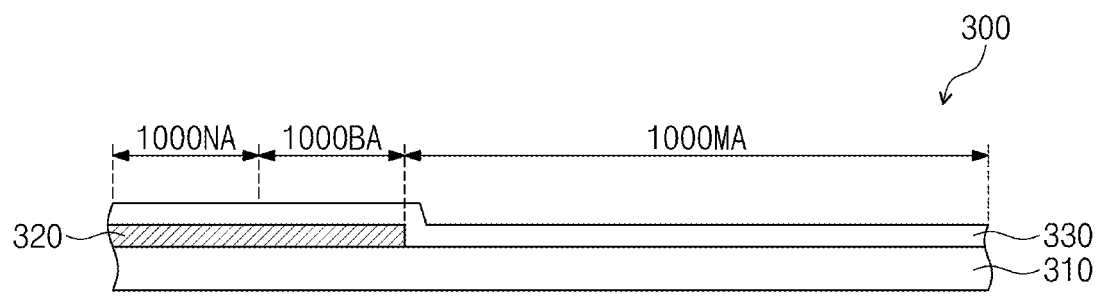
FIG. 4 is a cross-sectional view of an antenna according to an embodiment.

FIG. 4 is a cross-sectional view of the antenna according to an embodiment.

Referring to FIG. 4, the antenna 300 may include a base layer 310 (or a base), a conductive layer 320, and a cover layer 330.

The base layer 310 may overlap all of the first display surface 1000MA and the second display surface 1000BA. Thus, the base layer 310 may include an optically clear material. A radiation loss of the antenna 300 may be proportional to a dielectric constant of the base layer 310. When the base layer 310 includes a low dielectric material, a communication performance of the antenna 300 may improve. For example, the base layer 310 may include an olefin polymer.

The conductive layer 320 may be disposed on the base layer 310. The conductive layer 320 may include low resistance metal. Although the conductive layer 320 may include, e.g., copper, gold, or silver, the embodiment is not limited thereto. The conductive layer 320 may include a patch part, a first transmission part, and a second transmission part.

The conductive layer 320 may overlap the second display surface 1000BA and the non-display area 1000NA. However, the embodiment is not limited thereto. For example, the conductive layer 320 may also overlap the first display surface 1000MA.

When the conductive layer 320 includes an opaque material, openings may be defined in the conductive layer 320. In this case, an image displayed through the display area 1000A (refer to FIG. 1) may not be blocked by the conductive layer 320. For example, at least one of the patch part, the first transmission part, and the second transmission part may have a mesh structure in which openings are defined. For example, the patch part may have a mesh structure in which openings are defined, and each of the first and second transmission parts may have a structure in which openings are not defined. Alternatively, all of the patch part and the first and second transmission parts may have the mesh structure in which openings are defined.

The cover layer 330 may be disposed on the base layer 310 and cover the conductive layer 320. That is, the conductive layer 320 may be disposed between the cover layer 330 and the base layer 310. The cover layer 330 may include a silicon-based material. For example, the cover layer 330 may include at least one of a silicon oxide, a silicon nitride, and a silicon oxynitride.

Each of the base layer 310 and the cover layer 330 may overlap the entire display area 1000A (refer to FIG. 1) of the electronic device 1000 (refer again to FIG. 1). Thus, when the antenna 300 is bonded to each of the window 400 and the optical film 200, since a stepped portion of the antenna 300 decreases, a phenomenon in which bubbles are generated in an adhesion surface may be reduced or removed.

Figure 5:
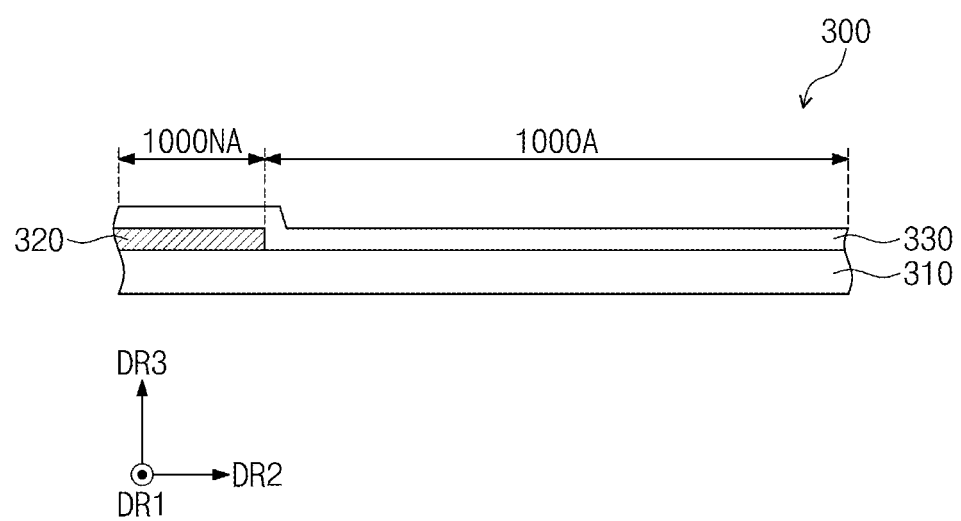
FIG. 5 is a cross-sectional view of an antenna according to an embodiment.

FIG. 5 is a cross-sectional view of the antenna according to an embodiment.

Referring to FIG. 5, the conductive layer 320 may overlap the non-display area 1000NA. The electronic device 1000 (refer to FIG. 1) may further include a bezel pattern disposed on the non-display area 1000NA. The bezel pattern may be a colored light shielding layer. Thus, although the conductive layer 320 includes an opaque material, since the conductive layer 320 is disposed on the non-display area 1000NA, an image displayed through the display area 1000A may not be blocked. In this case, each of components contained in the conductive layer 320, e.g., the patch part, the first transmission part, and the second transmission part, may have a structure in which openings are not defined (or a solid shape). However, the embodiment is not limited thereto. For example, at least one of the patch part, the first transmission part, and the second transmission part may have the mesh structure in which openings are defined.

Figure 6:
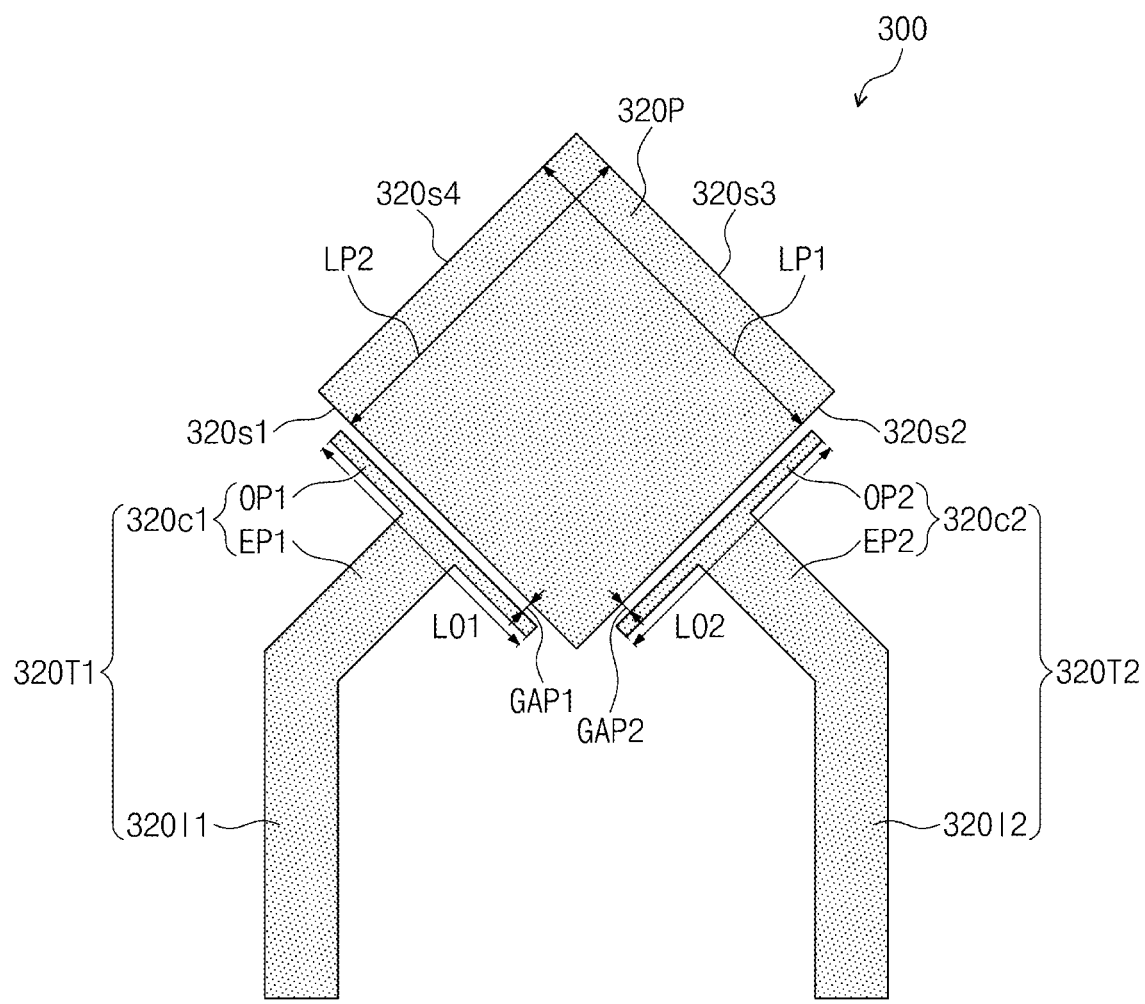
FIG. 6 is a plan view of the antenna according to an embodiment.

FIG. 6 is a plan view of the antenna according to an embodiment.

In FIG. 6, a patch part 320P, a first transmission part 320T1, and a second transmission part 320T2, which are contained in the antenna 300, are illustrated. Referring to FIGS. 2 and 6, the patch part 320P, the first transmission part 320T1, and the second transmission part 320T2 may be disposed on the display panel 100 (refer to FIG. 2). The optical film 200 (refer to FIG. 2) may be further disposed between the patch part 320P, the first transmission part 320T1, and the second transmission part 320T2 and the display panel 100 (refer to FIG. 2). According to an embodiment, the optical film 200 (refer to FIG. 3) may be omitted.

The patch part 320P, the first transmission part 320T1, and the second transmission part 320T2 may be disposed on the same layer. The patch part 320P, the first transmission part 320T1, and the second transmission part 320T2, which are component contained in the conductive layer 320 (refer to FIG. 4 or 5), may be disposed on the base layer 310 (refer to FIG. 4 or 5).

Each of the patch part 320P, the first transmission part 320T1, and the second transmission part 320T2 in FIG. 6 may have a shape in which openings are not defined. In this case, the patch part 320P, the first transmission part 320T1, and the second transmission part 320T2 may be disposed on the non-display area 1000NA (refer to FIG. 5) of the electronic device 1000 (refer to FIG. 5) as described in FIG. 5.

The patch part 320P may have a rectangular shape or a quadrilateral shape, and the patch part 320P may include a first side 320s1, a second side 320s2, a third side 320s3, and a fourth side 320s4. The first side 320s1 and the third side 320s3 may face each other and be spaced apart from each other in a first cross direction DRC1. The second side 320s2 and the fourth side 320s4 may face each other and be spaced apart from each other in a second cross direction DRC2.

Each of the first side 320s1 and the third side 320s3 may extend in a direction parallel to the second cross direction DRC2, and each of the second side 320s2 and the fourth side 320s4 may extend in a direction parallel to the first cross direction DRC1. The first side 320s1 may be connected to the second side 320s2 and the fourth side 320s4, and the third side 320s3 may be connected to the second side 320s2 and the fourth side 320s4. The first cross direction DRC1 may be a direction between the first direction DR1 and the second direction DR2, and the second cross direction DRC2 may be a direction perpendicular to the first cross direction DRC1.

The first side 320s1 and the third side 320s3 may have the same first length LP1. The first length LP1 may correspond to a width of the patch part 320P in the direction parallel to the second cross direction DRC2. The second side 320s2 and the fourth side 320s4 may have the same second length LP2. The second length LP2 may correspond to a width of the patch part 320P in the direction parallel to the first cross direction DRC1.

The first length LP1 and the second length LP2 may be equal to each other. For example, each of the first length LP1 and the second length LP2 may be about 3.05 mm (millimeter). However, the embodiment is not limited thereto. Since the first length LP1 and the second length LP2 are equal to each other, the patch part 320P may have a square shape or a diamond shape.

The first transmission part 320T1 may face the first side 320s1. The first transmission part 320T1 may be spaced a predetermined gap GAP1 from the first side 320s1. The first transmission part 320T1 and the patch part 320P may not be directly connected. The first transmission part 320T1 may be coupled with the patch part 320P. The first transmission part 320T1 may be capacitively coupled with the patch part 320P.

The second transmission part 320T2 may face the second side 320s2. The second transmission part 320T2 may be spaced a predetermined gap GAP2 from the second side 320s2. The second transmission part 320T2 and the patch part 320P may not be directly connected. The second transmission part 320T2 may be coupled with the patch part 320P. The second transmission part 320T2 may be capacitively coupled with the patch part 320P.

One patch part 320P may receive or transmit a signal or energy from two of the first and second transmission parts 320T1 and 320T2. The one patch part 320P may provide two polarized characteristics. For example, the one patch part 320P may provide a first polarized characteristic by a signal provided from the first transmission part 320T1 and a second polarized characteristic by a signal provided from the second transmission part 320T2.

As dual feeding is performed on the one patch part 320P by using the two first and second transmission parts 320T1 and 320T2, the characteristic of the antenna 300 may improve. For example, when the antenna 300 transmits a signal, a gain of the antenna 300 may improve because dual feeding is performed by the first and second transmission parts 320T1 and 320T2. Also, when the antenna 300 receives a signal, since the signal is received by the first and second transmission parts 320T1 and 320T2, a diversity method that selects a signal having the most preferable characteristic among various reception signals may be used.

The first transmission part 320T1 may include a first transmission line 320l1 and a first coupler 320c1 extending from the first transmission line 320l1 and facing the first side 320s1. The second transmission part 320T2 may include a second transmission line 320l2 and a second coupler 320c2 extending from the second transmission line 320l2 and facing the second side 320s2.

The first transmission part 320T1 and the second transmission part 320T2 may be spaced apart from each other in the first direction DR1. A portion of the patch part 320P may be disposed between a portion of the first transmission part 320T1 and a portion of the second transmission part 320T2. The first transmission part 320T1 and the second transmission part 320T2 may have shapes symmetric to each other. The first transmission part 320T1 and the second transmission part 320T2 may have line-symmetric shapes with respect to a reference line extending in the second direction DR2.

The first transmission line 320l1 and the second transmission line 320l2 may be spaced apart from each other in the first direction DR1, and each of the first transmission line 320l1 and the second transmission line 320l2 may extend in parallel to the second direction DR2 crossing the first direction DR1.

The first coupler 320c1 may include a first extension portion EP1 extending from the first transmission line 320l1 along the first cross direction DRC1 and a first facing portion OP1 extending along the second cross direction DRC2 crossing the first cross direction DRC1. The second coupler 320c2 may include a second extension portion EP2 extending from the second transmission line 320l2 along the second cross direction DRC2 and a second facing portion OP2 extending along the first cross direction DRC1 crossing the second cross direction DRC2. An angle between the first facing portion OP1 and the second facing portion OP2 may be about 90°.

The first extension portion EP1 may be connected to a central area of the first facing portion OP1, and the second extension portion EP2 may be connected to a central area of the second facing portion OP2. Thus, each of the first coupler 320c1 and the second coupler 320c2 may have a "T"-shape. The first coupler 320c1 and the second coupler 320c2 may be referred to as a first T-shaped coupler and a second T-shaped coupler, respectively. The first coupler 320c1 and the second coupler 320c2 may be also referred to as a first resonator and a second resonator, respectively.

Each of the first coupler 320c1 and the second coupler 320c2 may be coupled to the patch part 320P and transmit energy to the patch part 320P through the coupling (or capacitive coupling). A length LO1 of the first facing portion OP1, a length LO2 of the second facing portion OP2, the gap GAP1 between the first facing portion OP1 and the patch part 320P, and the gap GAP2 between the second facing portion OP2 and the patch part 320P may be design variables. For example, each of the length LO1 of the first facing portion OP1 and the length LO2 of the second facing portion OP2 may be about 2.3 mm, and each of the gap GAP1 between the first facing portion OP1 and the patch part 320P and the gap GAP2 between the second facing portion OP2 and the patch part 320P may be about 20 μm. However, the embodiment is not limited thereto. The length LO1 of the first facing portion OP1 may be less than the first length LP1 of the patch part 320P, and the length LO2 of the second facing portion OP2 may be less than the second length LP2 of the patch part 320P.

Figure 7:
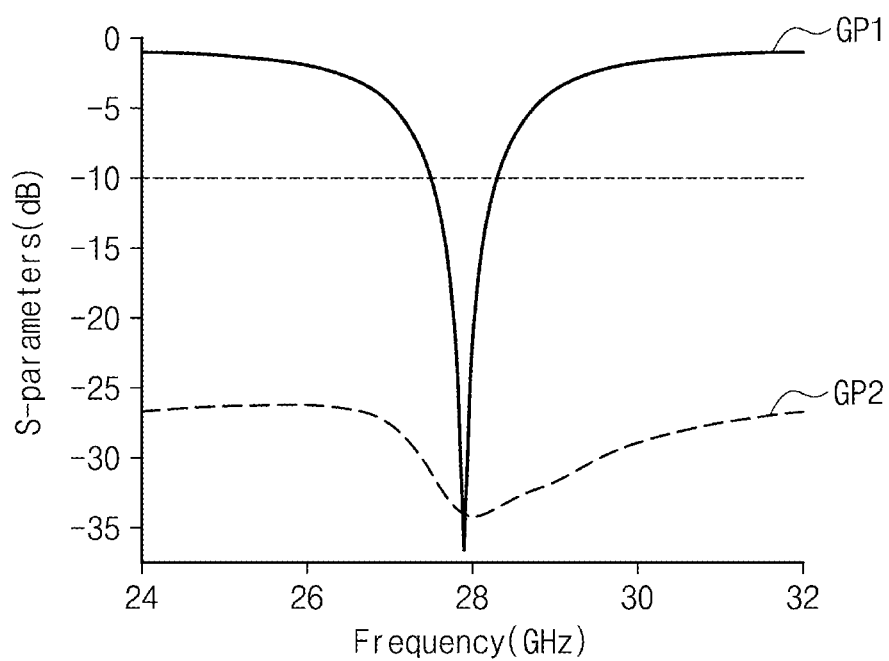
FIG. 7 is a graph representing a reflection coefficient of the antenna according to an embodiment.

FIG. 7 is a graph representing a reflection coefficient of the antenna according to an embodiment.

Referring to FIGS. 6 and 7, a first graph GP1 represents a reflection coefficient according to a frequency of the antenna 300 in FIG. 6, and a second graph GP2 represents a degree of isolation between the first transmission line 320l1 and the second transmission line 320l2.

The patch part 320P may be coupled with each of the first transmission part 320T1 and the second transmission part 320T2 and receive a signal through the coupling. A capacitance is generated between the patch part 320P and the first transmission part 320T1 and between the patch part 320P and the second transmission part 320T2. In this case, a reactance of the antenna 300 may be gently varied according to the frequency thereof. As a result, a fractional bandwidth at a central frequency may further increase when the patch part 320P is coupled with each of the first transmission part 320T1 and the second transmission part 320T2 than when the patch part 320P is directly connected with the first transmission part 320T1 and the second transmission part 320T2.

Referring to the first graph GP1, the antenna 300 may have a reflection loss characteristic of about −35 dB (decibel) or less at a frequency of about 27.9 GHz. The antenna 300 have a bandwidth of about 0.78 GHz at about −10 dB and a fractional bandwidth of about 2.80% at the central frequency.

Referring to the second graph GP2, a reflection loss characteristic between the first transmission line 320l1 and the second transmission line 320l2 may be about −25 dB or less at all frequency bands illustrated in FIG. 7. That is, the degree of isolation between the first transmission line 320l1 and the second transmission line 320l2 and a degree of isolation between a first port connected with the first transmission line 320l1 and a second port connected with the second transmission line 320l2 may improve. The feature of improvement of the characteristic of the degree of isolation may represent a feature of having high degree of isolation, and a case of having the reflection loss characteristic of about −25 dB or less may have the high degree of isolation.

Figure 8:
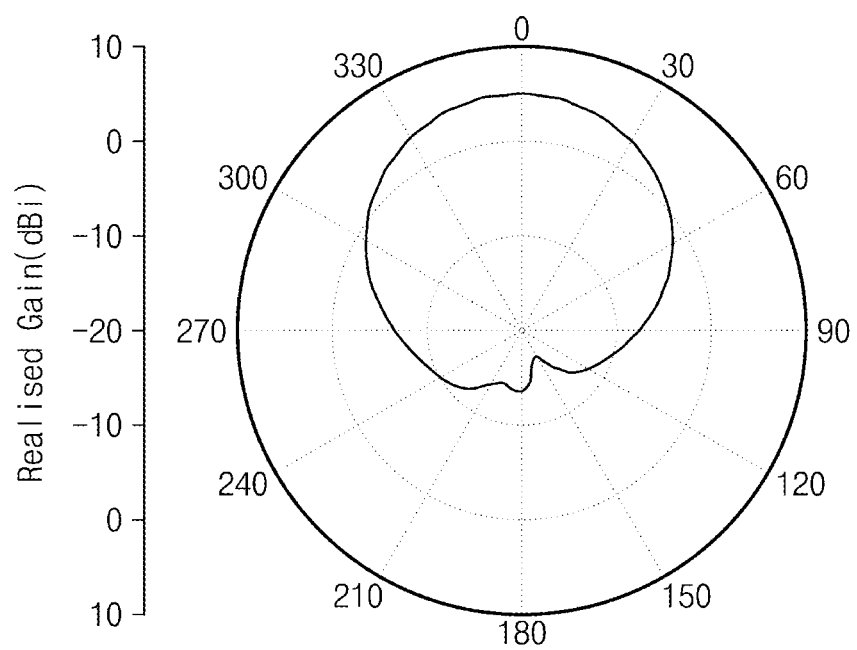
FIG. 8 illustrates a radiation pattern of the antenna.
Figure 9:
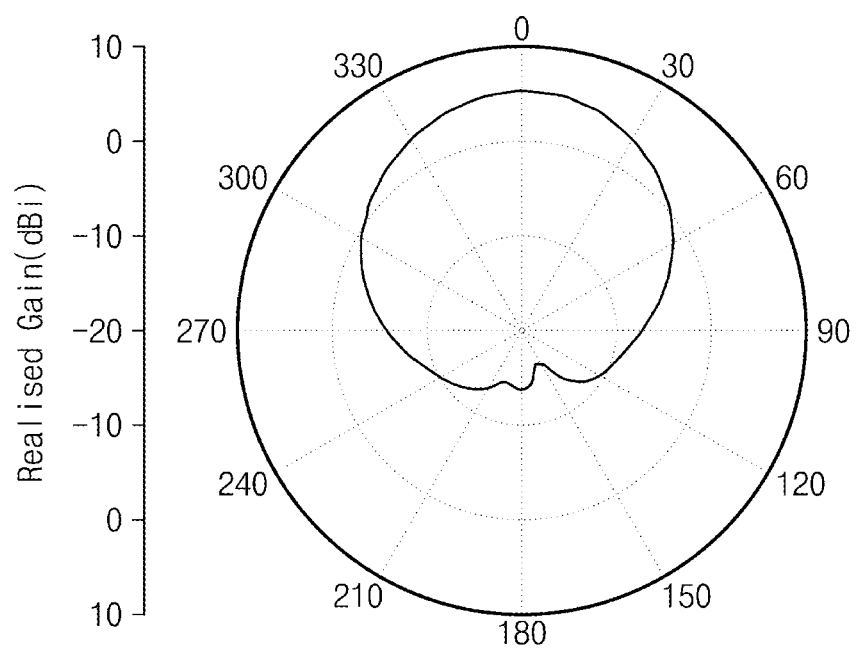
FIG. 9 illustrates a radiation pattern of the antenna.

FIG. 8 illustrates a radiation pattern of the antenna on a xz-plane, and FIG. 9 illustrates a radiation pattern of the antenna on a yz-plane.

Referring to FIGS. 5, 8, and 9, the xz-plane may be a plane defined by the first direction DR1 and the third direction DR3, and the yz-plane may be a plane defined by the second direction DR2 and the third direction DR3.

Referring to FIGS. 8 and 9, the antenna 300 has a radiation pattern having a directivity in a specific direction on all of the two planes. That is, it may be known that a radiation gain and lose or a radiation pattern distortion is not generated although a dual coupling feeding is performed on the antenna 300.

Figure 10A:
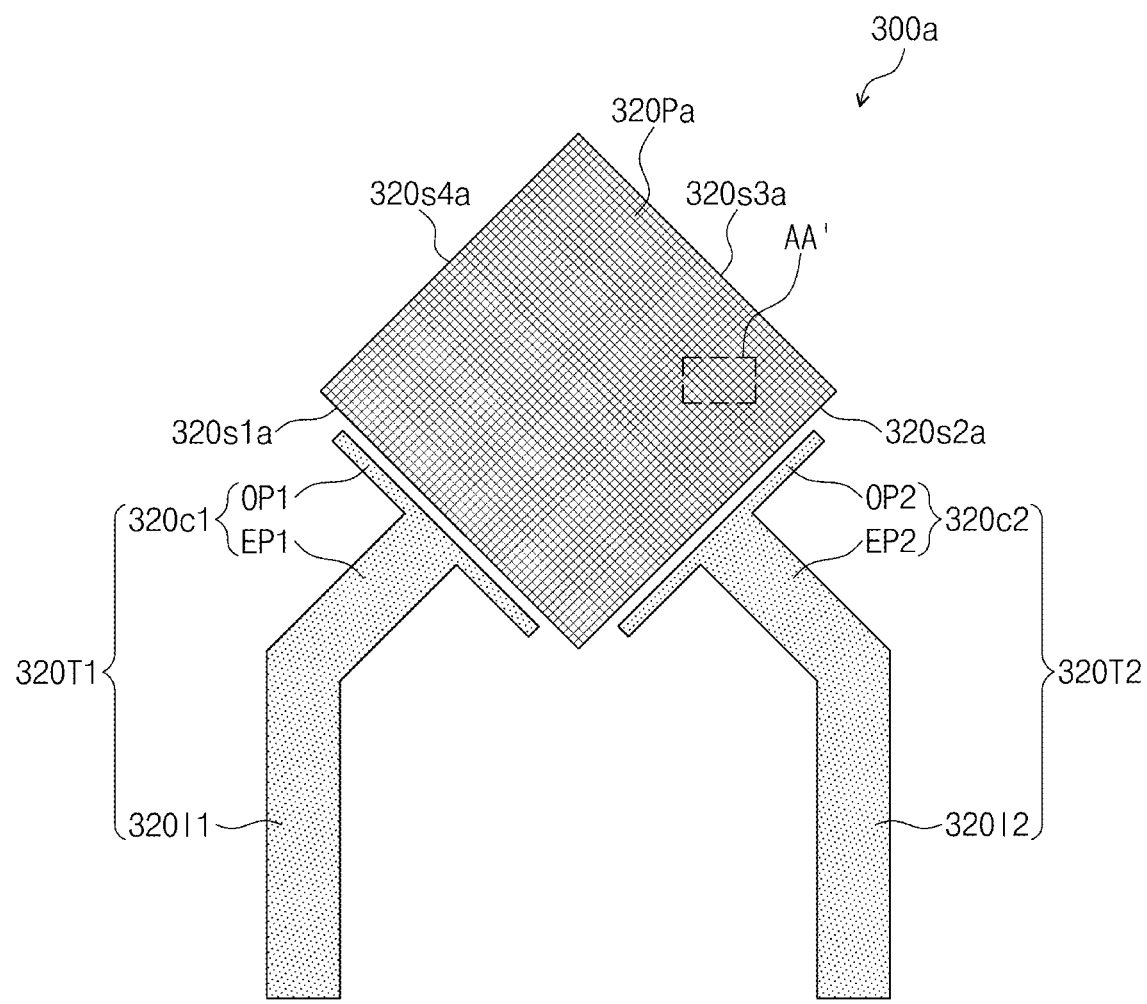
FIG. 10A is a plan view of an antenna according to an embodiment.
Figure 10B:
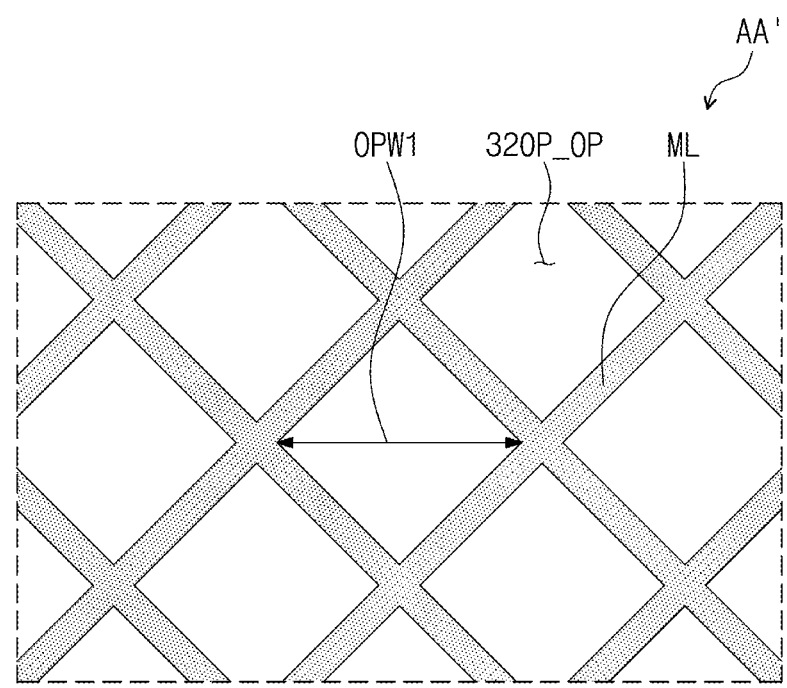
FIG. 10B is an enlarged view illustrating area AA' of FIG. 10A.
Figure 10B:
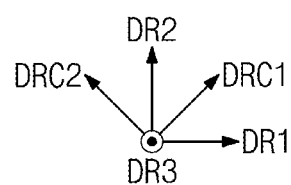

FIG. 10A is a plan view of an antenna according to an embodiment. FIG. 10B is an enlarged view illustrating area AA' of FIG. 10A. In describing FIGS. 10A and 10B, the same reference numerals will be given to the components described previously in FIG. 6, and a detailed description thereof will be omitted for sake of brevity.

Referring to FIGS. 10A and 10B, a patch part 320Pa, a first transmission part 320T1, and a second transmission part 320T2, which are contained in an antenna 300a, are illustrated.

The patch part 320Pa may have a mesh structure in which a plurality of openings 320P_OP is defined. The plurality of openings 320P_OP may overlap the light emitting area PXA (refer to FIG. 3). In this case, although mesh lines ML constituting the patch part 320Pa include an opaque material, light provided from the light emitting area PXA (refer to FIG. 3) may not be blocked by the patch part 320Pa. Although each of the mesh lines ML may have a width of about 1 mm, the embodiment is not limited thereto.

Since the plurality of openings 320P_OP is defined in the patch part 320Pa, transparency of the patch part 320Pa may increase. Thus, although the patch part 320Pa overlaps the display area 1000A (refer to FIG. 1), an image displayed through the display area 1000A (refer to FIG. 1) may not be blocked.

The patch part 320Pa may have a rectangular shape, and the patch part 320Pa may include a first side 320s1a, a second side 320s2a, a third side 320s3a, and a fourth side 320s4a. The first side 320s1a and the third side 320s3a may be defined by the mesh lines ML each extending in the second cross direction DRC2, respectively. The second side 320s2a and the fourth side 320s4a may be defined by the mesh lines ML each extending in the first cross direction DRC1, respectively.

Figure 11:
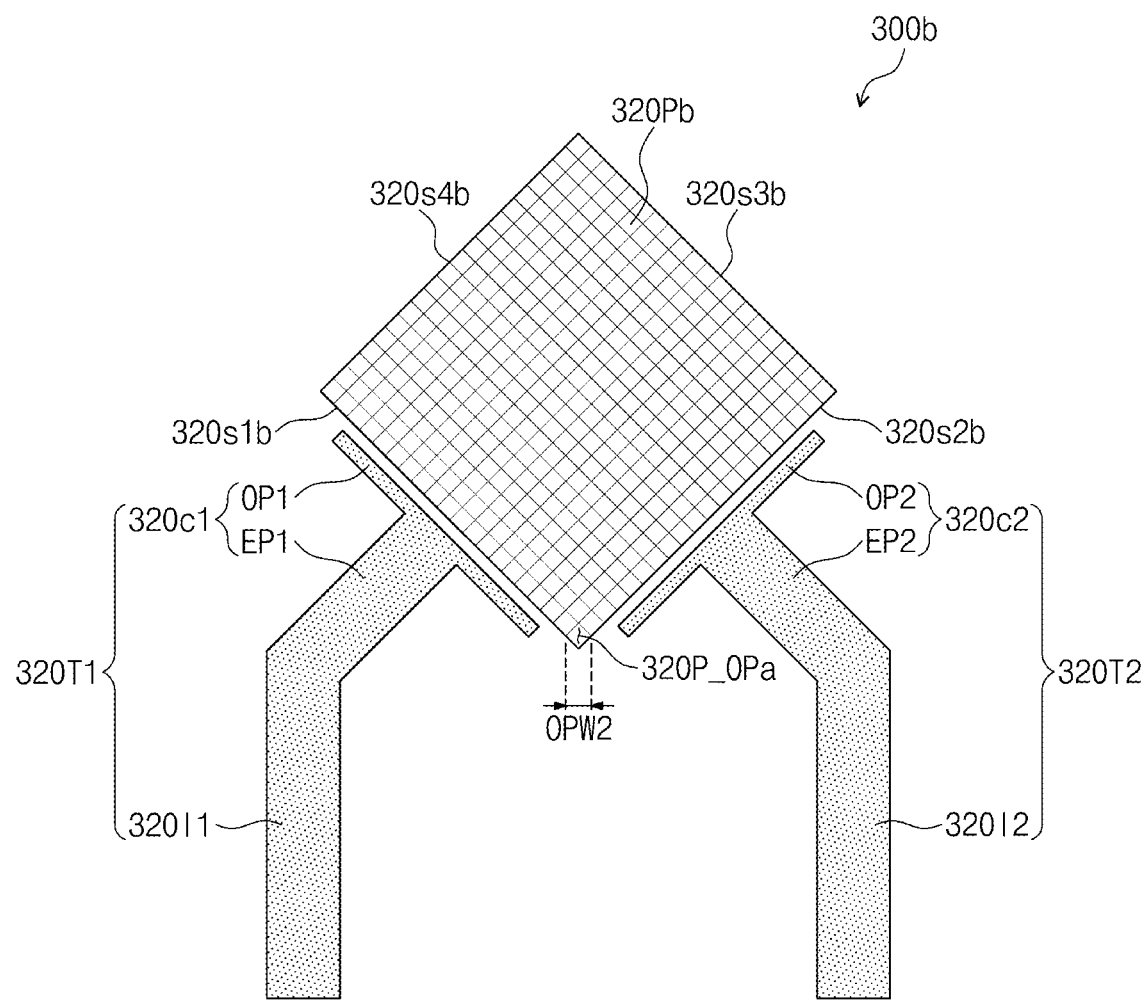
FIG. 11 is a plan view of an antenna according to an embodiment.

FIG. 11 is a plan view of an antenna according to an embodiment. In describing FIG. 11, the same reference numerals will be given to the components described previously in FIG. 6, and a detailed description thereof will be omitted for sake of brevity.

Referring to FIG. 11, a patch part 320Pb, a first transmission part 320T1, and a second transmission part 320T2, which are contained in an antenna 300b, are illustrated. The patch part 320Pb may have a mesh structure in which a plurality of openings 320P_OPa is defined.

Referring to FIGS. 10A, 10B, and 11, the opening 320P_OPa of the patch part 320Pb may have a size greater than that of the opening 320P_OP of the patch part 320Pa. Thus, the patch part 320Pb may have transparency greater than that of the patch part 320Pa.

Each of the opening 320P_OP of the patch part 320Pa and the opening 320P_OPa of the patch part 320Pb may have a diamond shape, and a diagonal length or a diagonal width OPW1 of the opening 320P_OP may be less than a diagonal length or a diagonal width OPW2 of the opening 320P_OPa. Each of the width OPW1 and the width OPW2 may be a width in a direction parallel to the first direction DR1. For example, the diagonal width OPW1 of the opening 320P_OP may be about 120 mm, and the diagonal width OPW2 of the opening 320P_OPa may be about 260 mm. However, the embodiment is not limited thereto.

Figure 12:
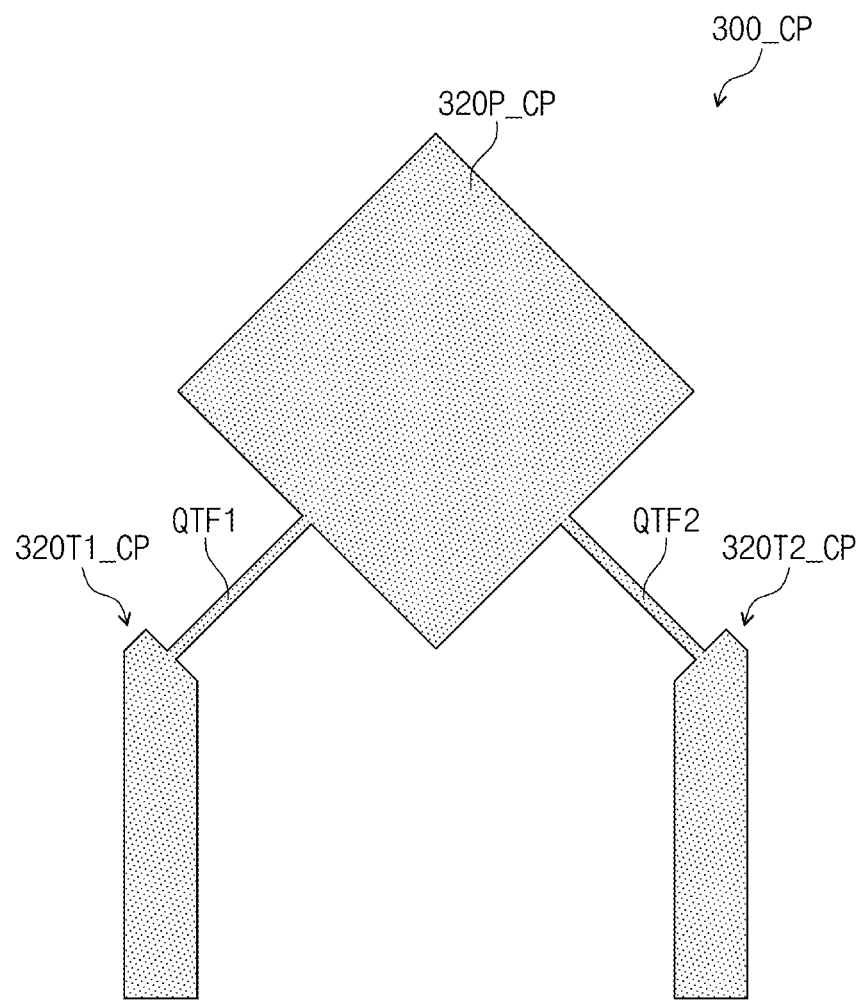
FIG. 12 is a plan view of an antenna according to a comparative example.

FIG. 12 is a plan view of an antenna according to a comparative example.

Referring to FIG. 12, an antenna 300_CP may include a patch part 320P_CP, a first transmission part 320T1_CP, and a second transmission part 320T2_CP. Each of the first transmission part 320T1_CP and the second transmission part 320T2_CP may be directly connected to the patch part 320P_CP.

The first transmission part 320T1_CP may include a ¼ converter QTF1, and the second transmission part 320T2_CP may include a ¼ converter QTF2. A width of each of the ¼ converter QTF1 and the ¼ converter QTF2 may be adjusted for impedance matching. For example, a width in a direction parallel to the second cross direction DRC2 of the ¼ converter QTF1 and a width in a direction parallel to the first cross direction DRC1 of the ¼ converter QTF2 may be adjusted.

Figure 13:
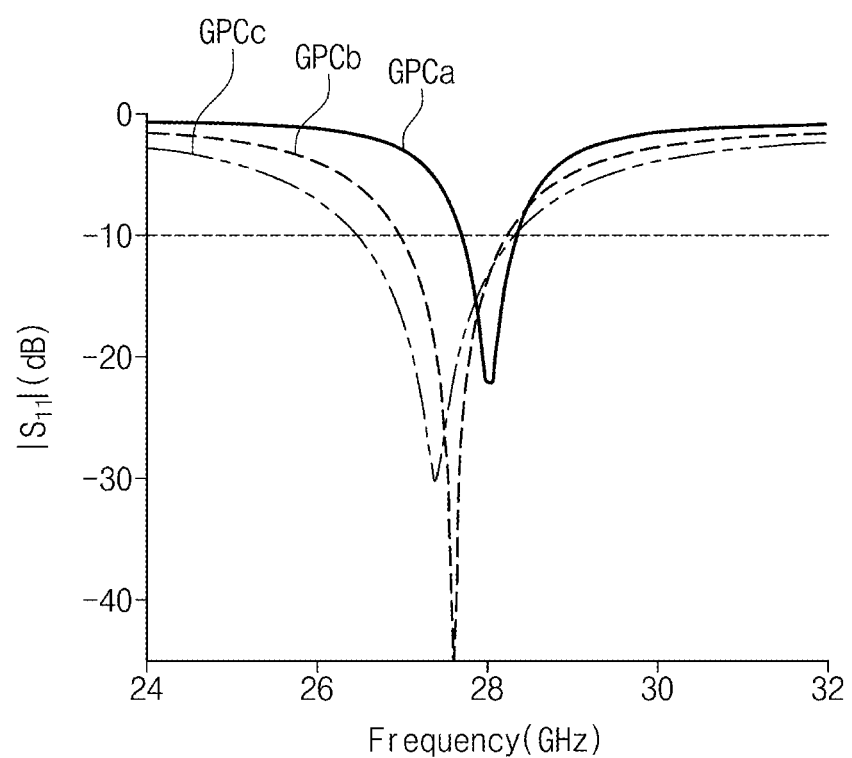
FIG. 13 is a graph representing reflection coefficients of antennas according to a comparative example.
Figure 14:
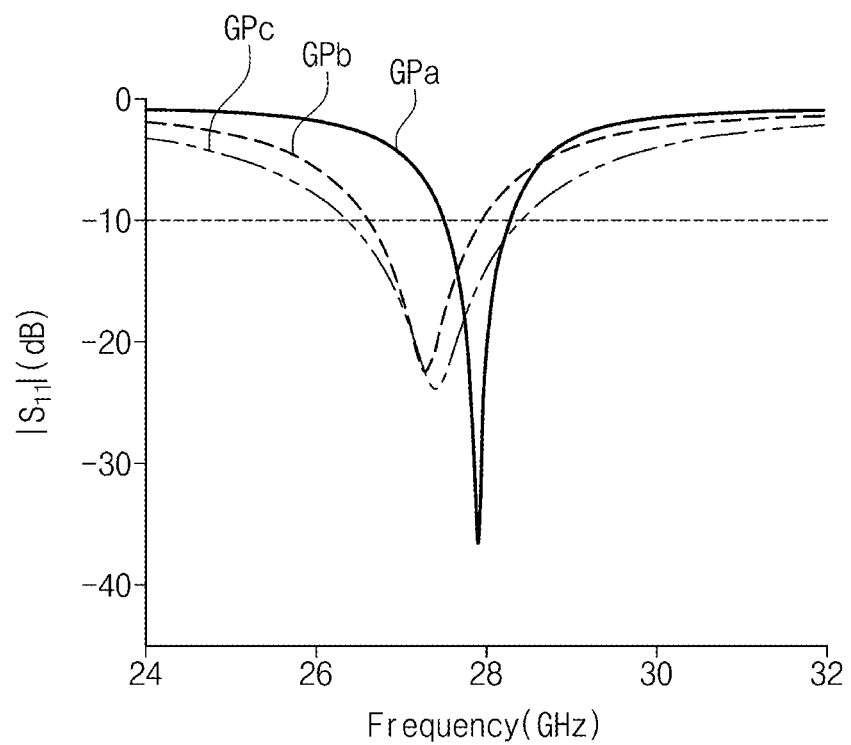
FIG. 14 is a graph representing reflection coefficients of the antennas according to an embodiment of the inventive concept.

FIG. 13 is a graph representing a reflection coefficient of antennas according to a comparative example. FIG. 14 is a graph representing reflection coefficients of the antennas according to an embodiment.

Referring to FIGS. 12 and 13, a first graph GPCa represents a reflection coefficient according to a frequency of the antenna 300_CP, a second graph GPCb represents a reflection coefficient according to a frequency when the patch part 320P_CP of the antenna 300_CP has the mesh structure in FIG. 10A, and a third graph GPCc represents a reflection coefficient according to a frequency when the patch part 320P_CP of the antenna 300_CP has the mesh structure in FIG. 11.

Referring to FIGS. 6, 10A, 11, and 14, a first graph GPa represents a reflection coefficient according to a frequency of the antenna 300, a second graph GPb represents a reflection coefficient according to a frequency of the antenna 300a, and a third graph GPc represents a reflection coefficient according to a frequency of the antenna 300b.

TABLE 1

| | Size of patch part (mm × mm) | Width of ¼ converter (mm) | Gap between patch part and facing portion (mm) | Length of facing portion (mm) |
|---|---|---|---|---|
| Comparative example 1 | 3.1 × 3.1 | 0.11 | — | — |
| Comparative example 2 | 3.14 × 3.14 | 0.25 | — | — |
| Comparative example 3 | 3.13 × 3.13 | 0.33 | — | — |
| Embodiment 1 | 3.05 × 3.05 | — | 0.02 | 2.3 |
| Embodiment 2 | 3.06 × 3.06 | — | 0.02 | 2.3 |
| Embodiment 3 | 2.94 × 2.94 | — | 0.02 | 2.3 |

Table 1 shows the first to third graphs GPCa, GPCb, and GPCc and design variable values of the antennas corresponding to the first to third graphs GPCa, GPCb, and GPCc. The first to third graphs GPCa, GPCb, and GPCc may one-to-one correspond to comparative examples 1, 2, and 3, respectively, and the first to third graphs GPa, GPb, and GPc may one-to- one correspond to embodiments 1, 2, and 3, respectively. In Table 1, the size of the patch part may represent the first length LP1 and the second length LP2 in FIG. 6, the width of the ¼ converter may represent a width of each of the /4 converters QTF1 and QTF2 in FIG. 12, the gap between the patch part and the facing portion may represent the gap GAP1 or GAP2 in FIG. 6, and the length of the facing portion may represent the length LO1 or LO2 in FIG. 6.

Referring to the comparative examples 1 to 3, an input impedance of the patch part may be varied when the shape of the patch part is changed from a structure in which openings are not defined to the mesh structure (from the comparative example 1 to the comparative example 2) and when changed from the mesh structure to the mesh structure (from the comparative example 2 to the comparative example 3). In this case, the width of the ¼ converter is required to be redesigned according to the variation of the input impedance.

According to an embodiment, the first transmission part 320T1 and the second transmission part 320T2 may be coupled with the patch part 320P, 320Pa, or 320Pb. Thus, as the shape of the patch part is additionally changed, a performance of the antenna may be secured although the design variables are not changed.

TABLE 2

| | Central frequency (GHz) | −10 dB bandwidth (GHz) | Fractional bandwidth at central frequency (%) |
|---|---|---|---|
| Comparative example 1 | 28.0 | 0.65 | 2.32 |
| Comparative example 2 | 27.6 | 1.27 | 4.6 |
| Comparative example 3 | 27.4 | 1.87 | 6.87 |
| Embodiment 1 | 27.9 | 0.78 | 2.80 |
| Embodiment 2 | 27.3 | 1.36 | 4.98 |
| Embodiment 3 | 27.4 | 2.08 | 7.59 |

Table 2 shows the first to third graphs GPCa, GPCb, and GPCc and values of the first to third graphs GPCa, GPCb, and GPCc. The patch part of the comparative example 1 and the embodiment 1 may have a shape in which openings are not defined, the patch part of the comparative example 2 and the embodiment 2 may have a shape in which an opening having a diagonal width of about 120 mm is defined, and the patch part of the comparative example 3 and the embodiment 3 may have a shape in which an opening having a diagonal width of about 260 mm is defined. It may be known that all of the bandwidth and the fractional bandwidth at the central frequency in the embodiments 1, 2, and 3 increase more than those in the comparative examples 1, 2, and 3. When described with reference to FIG. 6, since the patch part 320P is coupled with each of the first transmission part 320T1 and the second transmission part 320T2, a capacitance is generated between the patch part 320P and the first transmission part 320T1 and between the patch part 320P and the second transmission part 320T2. In this case, a reactance of the antenna may be gently varied according to the frequency thereof. As a result, the fractional bandwidth at the central frequency may further increase when the patch part 320P is coupled with each of the first transmission part 320T1 and the second transmission part 320T2 than when the patch part 320P_CP is directly connected with the first transmission part 320T1 CP and the second transmission part 320T2 CP.

Figure 15:
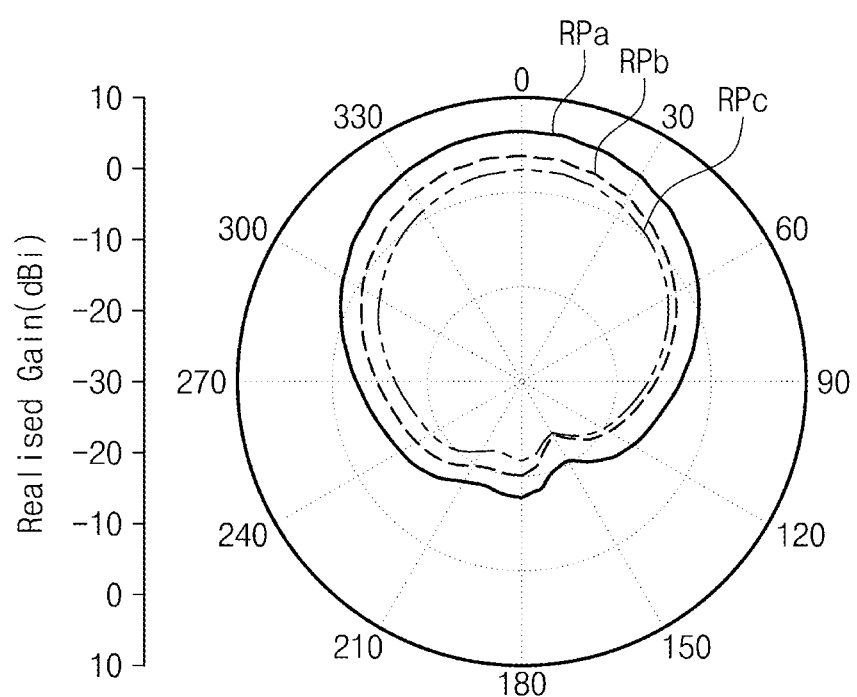
FIG. 15 illustrates radiation patterns according to embodiments.

FIG. 15 illustrates radiation patterns according to embodiments.

Referring to FIGS. 6, 10A, 11, and 15, a first radiation pattern RPa illustrates the radiation pattern of the antenna 300, a second radiation pattern RPb illustrates the radiation pattern of the antenna 300a, and a third radiation pattern RPc illustrates the radiation pattern of the antenna 300b. It may be known that the antenna 300, 300a, or 300b has the radiation pattern RPa, RPb, or RPc having a directivity in a specific direction although the shape of the patch part 320P, 320Pa, or 320Pb of the antenna 300, 300a, or 300b is changed.

Figure 16:
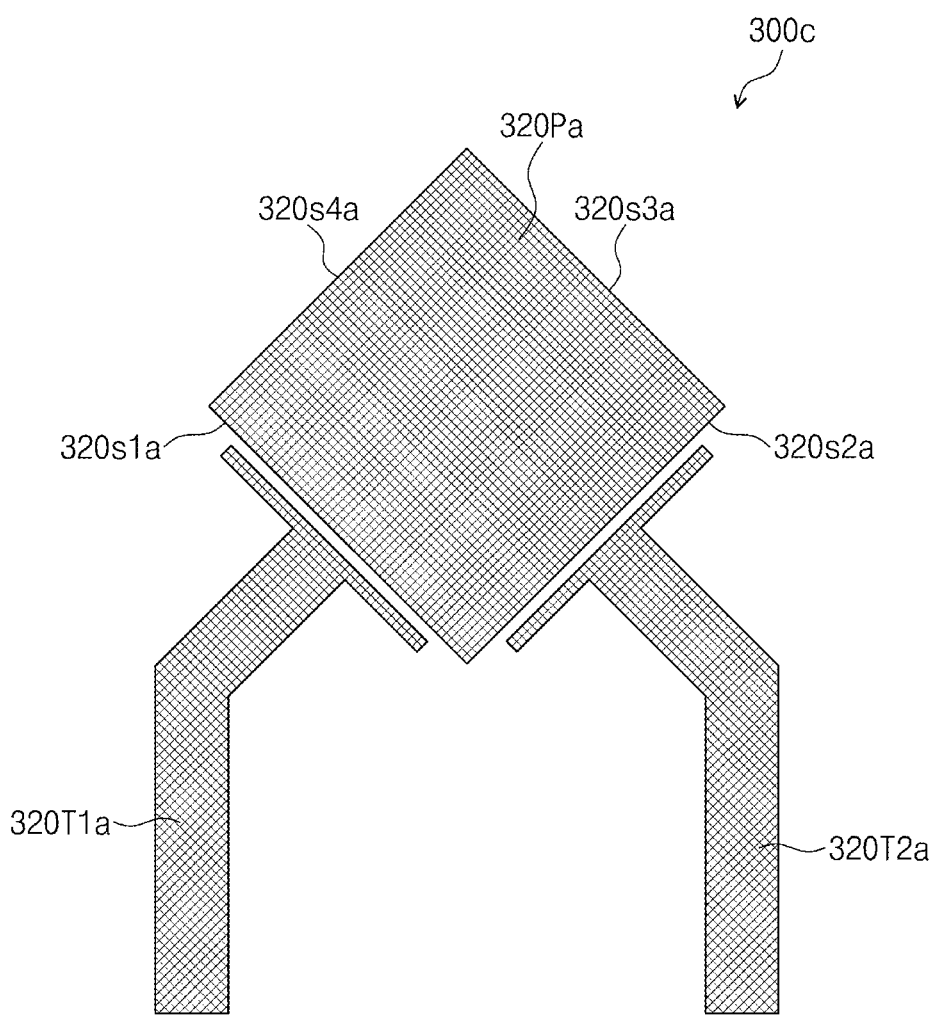
FIG. 16 is a plan view of an antenna according to an embodiment.

FIG. 16 is a plan view of an antenna according to an embodiment. In describing FIG. 16, the same reference numerals will be given to the components described previously in FIG. 10A, and a detailed description thereof will be omitted for sake of brevity.

Referring to FIG. 16, a patch part 320Pa, a first transmission part 320T1a, and a second transmission part 320T2a, which are contained in an antenna 300c, are illustrated.

The patch part 320Pa may be the same as the patch part 320Pa described previously in FIG. 10A. Each of the first transmission part 320T1a and the second transmission part 320T2a may have a mesh structure in which an opening is defined. The opening may overlap the light emitting area PXA (refer to FIG. 3). In this case, although mesh lines ML (refer to FIG. 10B) constituting the patch part 320Pa, the first transmission part 320T1a, and the second transmission part 320T2a include an opaque material, light provided from the light emitting area PXA (refer to FIG. 3) may not be blocked by the patch part 320Pa, the first transmission part 320T1a, and the second transmission part 320T2a.

Figure 17:
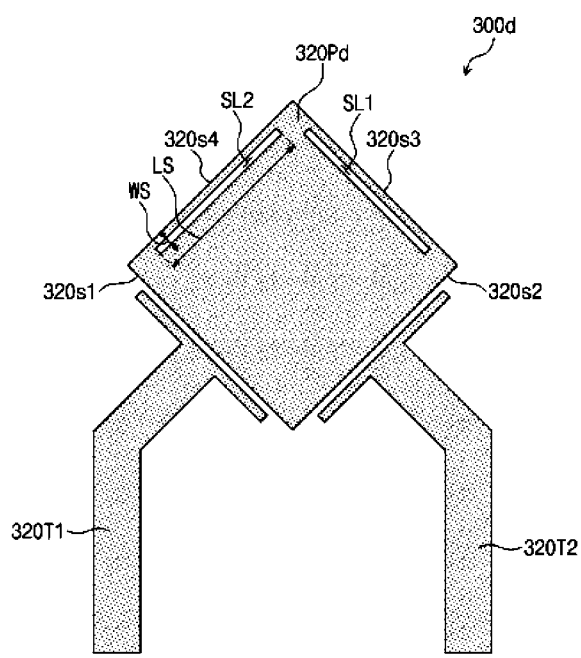
FIG. 17 is a plan view of an antenna according to an embodiment.

FIG. 17 is a plan view of an antenna according to an embodiment. In describing FIG. 17, the same reference numerals will be given to the components described previously in FIG. 6, and a detailed description thereof will be omitted for sake of brevity.

Referring to FIG. 17, a patch part 320Pd, a first transmission part 320T1, and a second transmission part 320T2, which are contained in an antenna 300d, are illustrated.

A first slot SL1 and a second slot SL2 may be defined in the patch part 320Pd. The first slot SL1 may be defined in one area of the patch part 320Pd, which faces a third side 320s3. The second slot SL2 may be defined in one area of the patch part 320Pd, which faces a fourth side 320s4. The first slot SL1 and the second slot SL2 may be defined by removing a portion of the conductive layer 320 (refer to FIG. 4 or 5). That is, the first slot SL1 and the second slot SL2 may be referred to as a first groove and a second groove, respectively, or referred to as a first opening and a second opening, respectively.

A resonant frequency band of the antenna 300d may be added by the first slot SL1 and the second slot SL2. The resonant frequency band may be determined by adjusting a length LS and a width WS of each of the first slot SL1 and the second slot SL2. For example, an additional resonance may be generated in a band adjacent to or a band spaced apart from the resonant frequency of the antenna 300 in FIG. 6 by the first slot SL1 and the second slot SL2. For example, the antenna 300d may be used for communication of about 28 GHz and about 39 GHz. In this case, the electronic device 1000 (refer to FIG. 1) in which the antenna 300d is applied may perform 5G communication in various regions, e.g., Asian countries and North and/or South American countries.

Although each of the patch part 320Pd, the first transmission part 320T1, and the second transmission part 320T2 has a shape in which openings are not defined as an example in FIG. 17, the embodiment is not limited thereto. For example, at least one of the patch part 320Pd, the first transmission part 320T1, and the second transmission part 320T2 may have a mesh structure including an opening. For example, when the patch part 320Pd has the mesh structure, the first slot SL1 and the second slot SL2 may be provided by removing a portion of the mesh structure.

Figure 18:
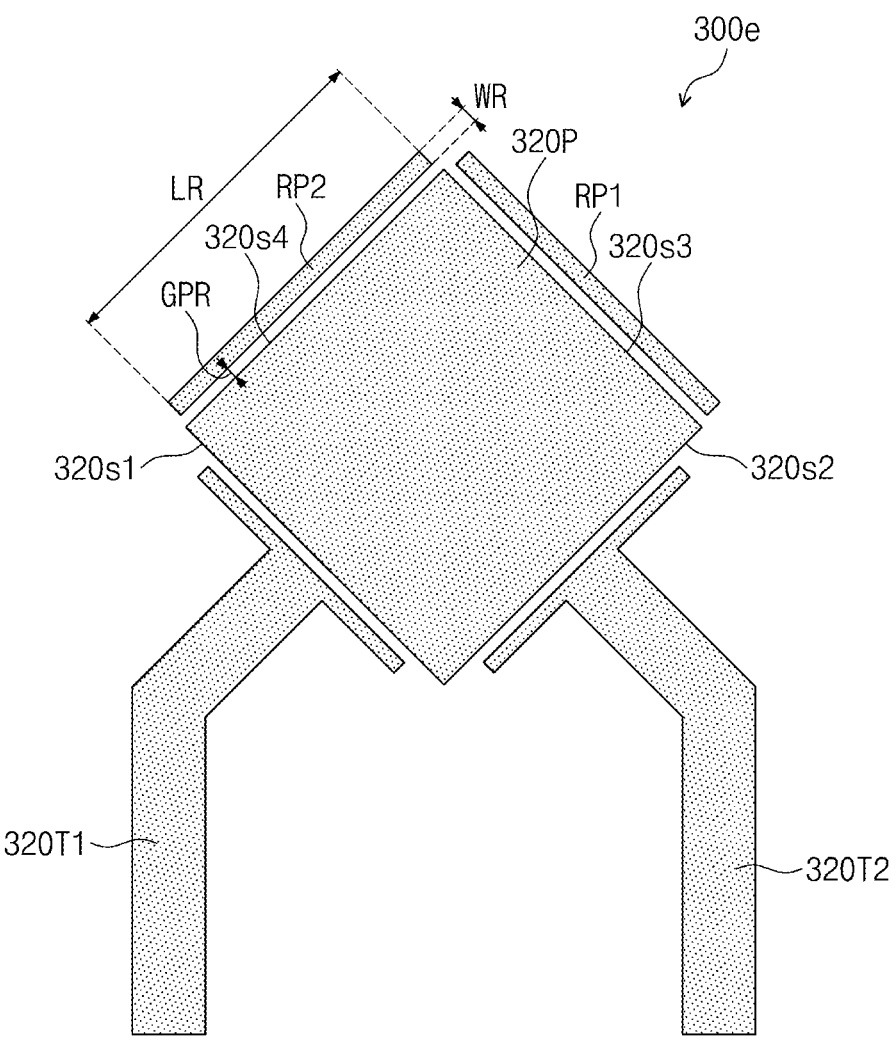
FIG. 18 is a plan view of an antenna according to an embodiment.

FIG. 18 is a plan view of an antenna according to an embodiment. In describing FIG. 18, the same reference numerals will be given to the components described previously in FIG. 6, and a detailed description thereof will be omitted for sake of brevity.

Referring to FIG. 18, a patch part 320P, a first transmission part 320T1, a second transmission part 320T2, a first radiation part RP1, and a second radiation part RP2, which are contained in an antenna 300e, are illustrated.

The first radiation part RP1 may face a third side 320s3 of the patch part 320P and be spaced apart from the patch part 320P. The second radiation part RP2 may face a fourth side 320s4 of the patch part 320P and be spaced apart from the patch part 320P. Each of the first radiation part RP1 and the second radiation part RP2 may be coupled with the patch part 320P.

The added resonant frequency band may be determined by adjusting a length LR and a width WR of each of the first radiation part RP1 and the second radiation part RP2 and a gap GPR with the patch part 320P. For example, an additional resonance may be generated in a band adjacent to or a band spaced apart from the resonant frequency of the antenna 300 in FIG. 6 by the first radiation part RP1 and the second radiation part RP2.

Although each of the patch part 320P, the first transmission part 320T1, the second transmission part 320T2, the first radiation part RP1, and the second radiation part RP2 has a shape in which openings are not defined as an example in FIG. 18, the embodiment is not limited thereto. For example, at least one of the patch part 320P, the first transmission part 320T1, the second transmission part 320T2, the first radiation part RP1, and the second radiation part RP2 may have a mesh structure including an opening.

Figure 19:
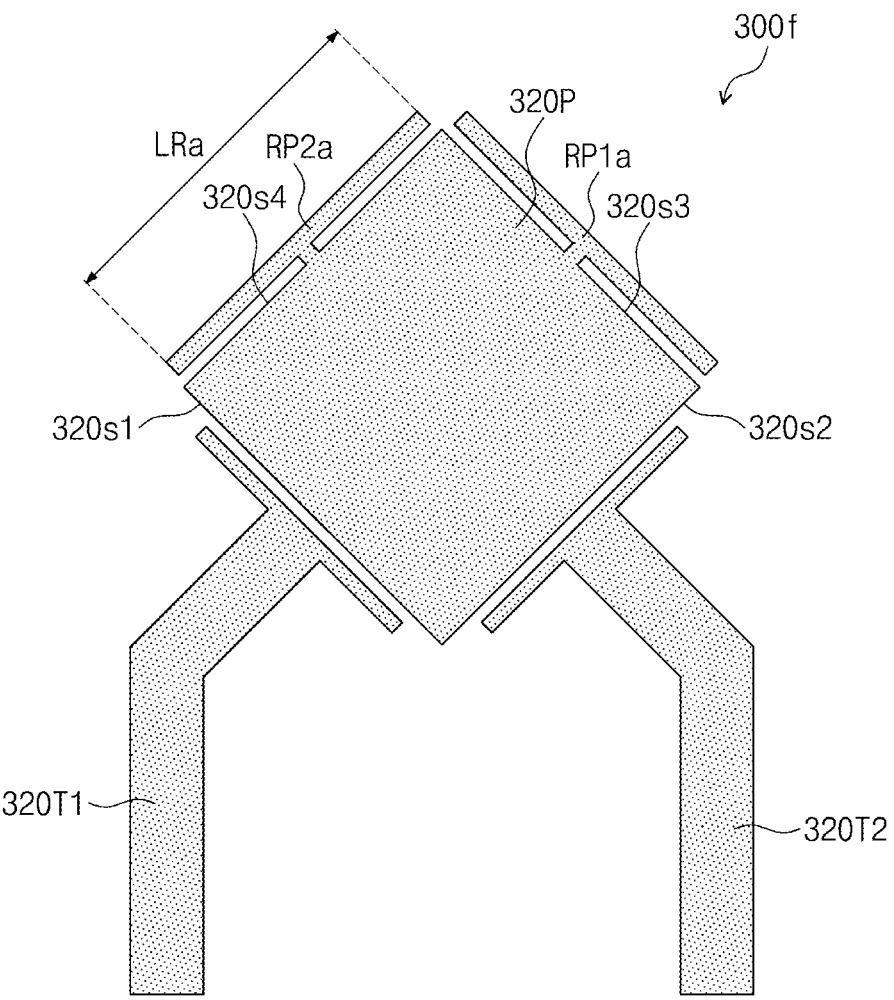
FIG. 19 is a plan view of an antenna according to an embodiment.

FIG. 19 is a plan view of an antenna according to an embodiment. In describing FIG. 19, the same reference numerals will be given to the components described previously in FIG. 6, and a detailed description thereof will be omitted for sake of brevity.

Referring to FIG. 19, a patch part 320P, a first transmission part 320T1, a second transmission part 320T2, a first radiation part RP1a, and a second radiation part RP2a, which are contained in an antenna 300f, are illustrated.

The first radiation part RP1a may face a third side 320s3 of the patch part 320P and be connected with the third side 320s3 of the patch part 320P. The second radiation part RP2a may face a fourth side 320s4 of the patch part 320P and be connected with the fourth side 320s4 of the patch part 320P.

The added resonant frequency band may be determined by adjusting a length LRa of each of the first radiation part RP1a and the second radiation part RP2a. For example, an additional resonance may be generated in a band adjacent to or a band spaced apart from the resonant frequency of the antenna 300 in FIG. 6 by the first radiation part RP1a and the second radiation part RP2a.

Although each of the patch part 320P, the first transmission part 320T1, the second transmission part 320T2, the first radiation part RP1a, and the second radiation part RP2a has a shape in which openings are not defined as an example in FIG. 19, the embodiment is not limited thereto. For example, at least one of the patch part 320P, the first transmission part 320T1, the second transmission part 320T2, the first radiation part RP1a, and the second radiation part RP2 may have a mesh structure including an opening.

Figure 20:
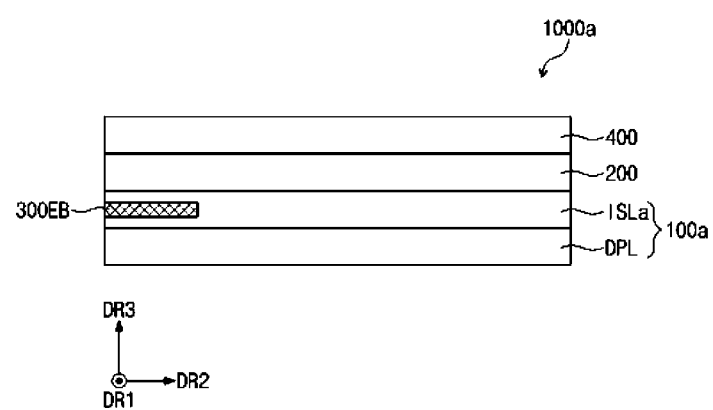
FIG. 20 is a schematic cross-sectional view of an electronic device according to an embodiment.

FIG. 20 is a schematic cross-sectional view of an electronic device according to an embodiment.

Referring to FIG. 20, the electronic device 1000a may include a display panel 100a, an optical film 200, an antenna 300EB, and a window 400. The display panel 100a may include a display layer DPL and a sensor layer ISLa disposed on the display layer DPL. The antenna 300EB may be embedded in the sensor layer ISLa.

Figure 21:
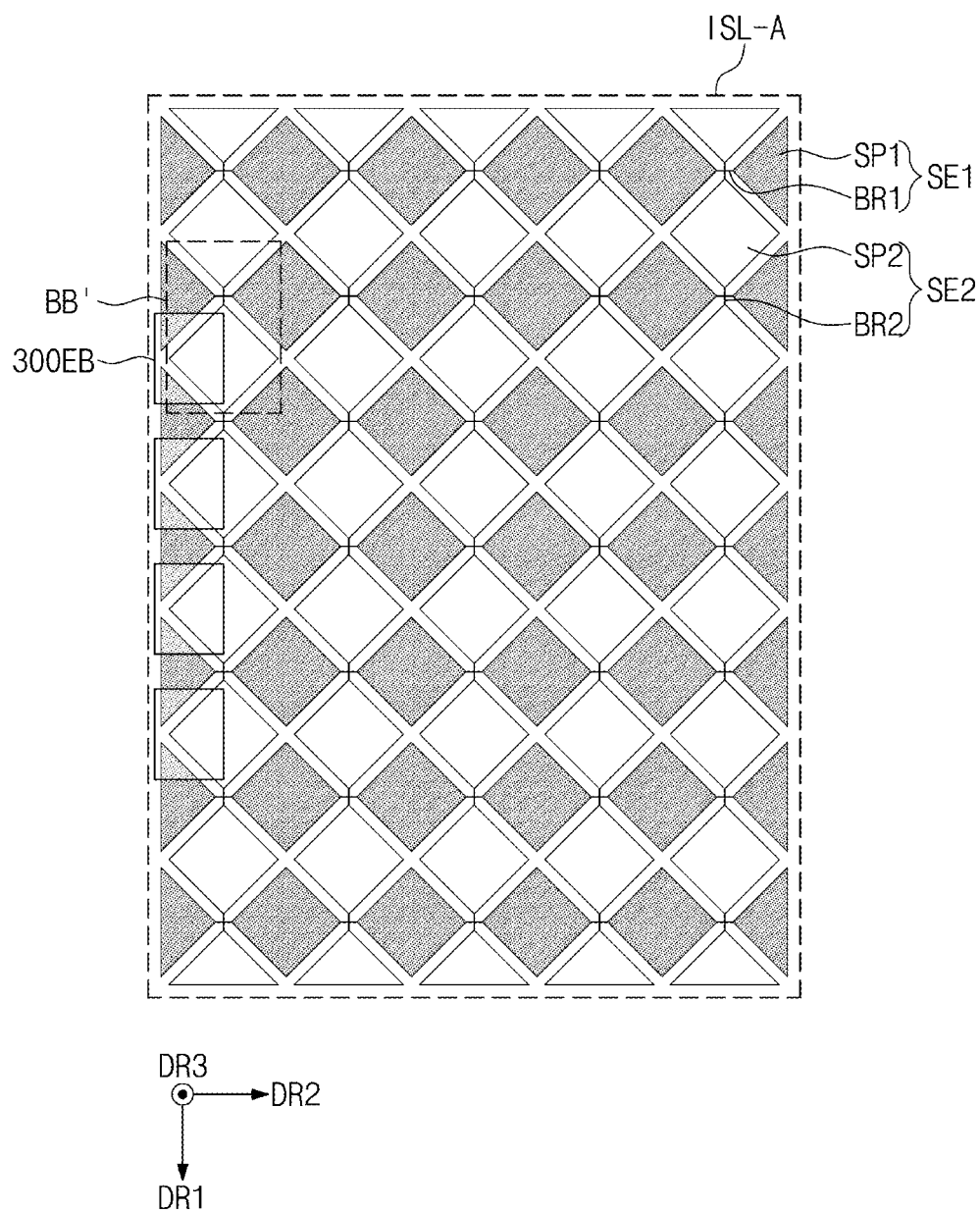
FIG. 21 is a plan view illustrating some components of a sensor layer according to an embodiment.
Figure 22:
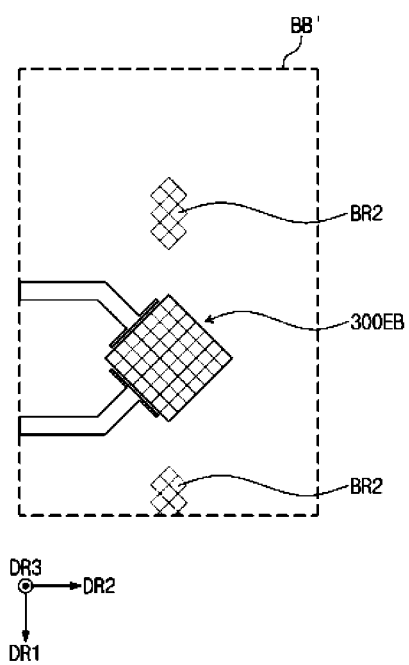
FIG. 22 is a plan view illustrating one conductive layer contained in area BB' of FIG. 21.
Figure 23:
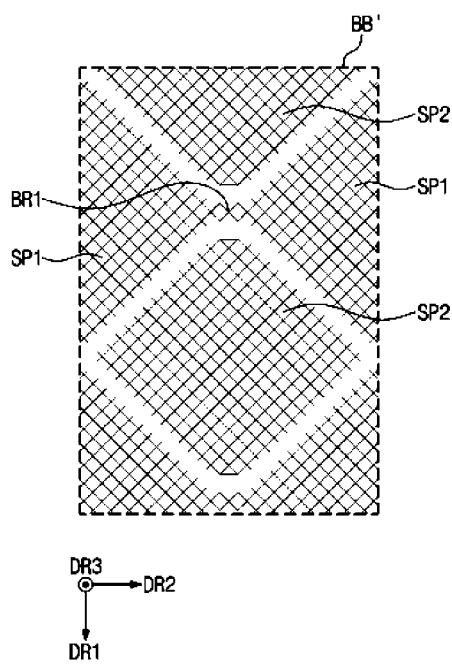
FIG. 23 is a plan view illustrating one conductive layer contained in area BB' of FIG. 21.

FIG. 21 is a plan view illustrating some components of the sensor layer according to an embodiment. FIG. 22 is a plan view illustrating one conductive layer contained in area BB' of FIG. 21. FIG. 23 is a plan view illustrating one conductive layer contained in area BB' of FIG. 21.

Referring to FIGS. 21, 22, and 23, a sensing area ISL-A may be defined in a sensor layer ISLa, and the sensing area ISL-A may correspond to the display area 1000A (refer to FIG. 1) of the electronic device 1000 (refer to FIG. 1).

The sensor layer ISLa may include a plurality of electrodes SE1, a plurality of cross electrodes SE2, and a plurality of antennas 300EB. The electronic device 1000 (refer to FIG. 1) may obtain coordinate information on an external input through variation of mutual capacitance between the electrodes SE1 and the cross electrodes SE2.

Each of the electrodes SE1 may extend in the second direction DR2, and the electrodes SE1 may be spaced apart from each other in the first direction DR1. Each of the cross electrodes SE2 may extend in the first direction DR1, and the cross electrodes SE2 may be spaced apart from each other in the second direction DR2. The electrodes SE1 and the cross electrodes SE2 may cross each other.

Each of the electrodes SE1 may include a first portion SP1 and a second portion BR1. Each of the cross electrodes SE2 may include a sensing pattern SP2 and a bridge pattern BR2. The first portion SP1 may face the sensing pattern SP2, and the second portion BR1 may cross the bridge pattern BR2 in an insulation manner. When viewed on a plane, the second portion BR1 may cross the bridge pattern BR2.

The electrodes SE1 and the sensing pattern SP2 may be disposed on the same layer, and the bridge pattern BR2 may be disposed on a layer different from the electrodes SE1 and the sensing pattern SP2. For example, the electrodes SE1 and the sensing pattern SP2 may be contained in the first conductive layer 160 (refer to FIG. 3), and the antenna 300EB and the bridge pattern BR2 may be contained in the second conductive layer 180 (refer to FIG. 3). This may be referred to as a top-bridge structure. Alternatively, the electrodes SE1 and the sensing pattern SP2 may be contained in the second conductive layer 180 (refer to FIG. 3), and the antenna 300EB and the bridge pattern BR2 may be contained in the first conductive layer 160 (refer to FIG. 3). This may be referred to as a bottom-bridge structure.

The conductive layer including the antenna 300EB and the bridge pattern BR2, e.g., the first or second conductive layer 160 or 180 (refer to FIG. 3) may further include a dummy pattern. The dummy pattern may be disposed on an area in which the antenna 300EB and the bridge pattern BR2 are not disposed. In this case, a difference between reflectances of an area in which the antenna 300EB and the bridge pattern BR2 are disposed and an area in which the antenna 300EB and the bridge pattern BR2 are not disposed may decrease. Thus, the antenna 300EB and the bridge pattern BR2 may not be viewed from the outside. The dummy pattern may electrically float, and the dummy pattern may be electrically insulated from the antenna 300EB and the bridge pattern BR2.

Although the patch part of the antenna 300EB has a mesh structure, and the transmission parts of the antenna 300EB have a shape in which openings are not defined as an example in FIG. 22, the embodiment is not limited thereto. For example, the antenna 300EB may be replaced by one of the antennas 300, 300a, 300b, 300c, 300d, 300e, and 300f in FIGS. 6, 10A, 11, and 16 to 19.

As described above, the electronic device may include the antenna on which the dual coupling feeding is performed. As the dual feeding is performed on the one patch part by using the two of the first and second transmission parts, the antenna characteristic may improve. The patch part may be coupled with each of the first and second transmission parts and receive a signal through the coupling. The capacitance may be generated between the patch part and the first transmission part and between the patch part and the second transmission part. In this case, the reactance of the antenna may be gently varied according to the frequency thereof. As a result, the fractional bandwidth at the central frequency of the antenna may further increase.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic device comprising:
   a display panel;
   a patch part disposed on the display panel and comprising a first side and a second side;
   a first transmission part disposed on the display panel, facing the first side of the patch part, spaced apart from the patch part, and coupled with the patch part; and
   a second transmission part disposed on the display panel, facing the second side of the patch part, spaced apart from the patch part, and coupled with the patch part.
   wherein the first transmission part is spaced a predetermined gap from the first side, the first transmission part and the patch part are not directly connected, and
   wherein the second transmission part is spaced a predetermined gap from the second side, the second transmission part and the patch part are not directly connected.

2. The electronic device of claim 1, wherein the first transmission part comprises a first transmission line and a first coupler extending from the first transmission line and facing the first side, and
   the second transmission part comprises a second transmission line and a second coupler extending from the second transmission line and facing the second side.

3. The electronic device of claim 2, wherein the first transmission line and the second transmission line are spaced apart from each other in a first direction, and each of the first transmission line and the second transmission line extends in parallel to a second direction crossing the first direction.

4. The electronic device of claim 3, wherein the first coupler comprises a first extension portion extending from the first transmission line in a first crossing direction between the first direction and the second direction and a first facing portion extending in a second crossing direction crossing the first crossing direction,
   the second coupler comprises a second extension portion extending from the second transmission line in the second crossing direction and a second facing portion extending in the first crossing direction, and the first facing portion faces the first side of the patch part, and the second facing portion faces the second side of the patch part.

5. The electronic device of claim 4, wherein the first extension portion is connected with a central area of the first facing portion, and the second extension portion is connected with a central area of the second facing portion.

6. The electronic device of claim 4, wherein the first side of the patch part is parallel to the second crossing direction, and the second side of the patch part is parallel to the first crossing direction.

7. The electronic device of claim 4, wherein a length of the first side of the patch part is greater than that of the first facing portion, and a length of the second side of the patch part is greater than that of the second facing portion.

8. The electronic device of claim 1, wherein the first side of the patch part has a same length or substantially the same length as the second side of the patch part.

9. The electronic device of claim 1, wherein the first transmission part and the second transmission part have shapes symmetric to each other.

10. The electronic device of claim 1, wherein the patch part has a mesh structure in which a plurality of openings is defined.

11. The electronic device of claim 1, wherein the patch part further comprises a third side facing the second side and connected with the first side and a fourth side facing the first side and connected with the third side and the second side, and the patch part has a rectangular or substantially rectangular shape.

12. The electronic device of claim 11, wherein a first slot facing the third side and extending in a direction parallel to the third side and a second slot facing the fourth side and extending in a direction parallel to the fourth side are defined in the patch part.

13. The electronic device of claim 11, further comprising:
a first radiation part disposed on the display panel, facing the third side of the patch part, spaced apart from the patch part, and coupled with the patch part; and
a second radiation part disposed on the display panel, facing the fourth side of the patch part, spaced apart from the patch part, and coupled with the patch part.

14. The electronic device of claim 11, further comprising:
a first radiation part disposed on the display panel, facing the third side of the patch part, and connected with the third side of the patch part; and
a second radiation part disposed on the display panel, facing the fourth side of the patch part, and connected with the fourth side of the patch part.

15. The electronic device of claim 1, wherein each of the first transmission part and the second transmission part has a mesh structure in which a plurality of openings is defined.

16. The electronic device of claim 1, further comprising:
a first radiation part facing the third side of the patch part and connected with the third side of the patch part; and
a second radiation part facing the fourth side of the patch part and connected with the fourth side of the patch part.

17. An electronic device comprising:
a patch part;
a first transmission part facing the patch part, spaced apart from the patch part, and coupled with the patch part; and
a second transmission part facing the patch part, spaced apart from the patch part, and coupled with the patch part,
wherein each of the first transmission part and the second transmission part comprises a transmission line and a coupler facing the patch part, the coupler comprises an extension portion extending from the transmission line and a facing portion extending in a direction crossing an extension direction of the extension portion and facing the patch part, and the extension portion is connected with a central area of the facing portion,
wherein the first transmission part is spaced a predetermined gap from the first side, the first transmission part and the patch part are not directly connected, and
wherein the second transmission part is spaced a predetermined gap from the second side, the second transmission part and the patch part are not directly connected.

18. The electronic device of claim 17, wherein the patch part comprises a first side facing the first transmission part, a second side facing the second transmission part and connected with the first side, a third side facing the second side and connected with the first side, and a fourth side facing the first side and connected with the third side and the second side, and the patch part has a rectangular or substantially rectangular shape.

19. The electronic device of claim 18, wherein a first slot facing the third side and extending in a direction parallel to the third side and a second slot facing the fourth side and extending in a direction parallel to the fourth side are defined in the patch part.

20. The electronic device of claim 18, further comprising:
a first radiation part facing the third side of the patch part, spaced apart from the patch part, and coupled with the patch part; and
a second radiation part facing the fourth side of the patch part, spaced apart from the patch part, and coupled with the patch part.

* * * * *

UNITED STATES PATENT AND TRADEMARK OFFICE
CERTIFICATE OF CORRECTION

| | | |
|---|---|---|
| PATENT NO. | : 11,757,194 B2 | Page 1 of 1 |
| APPLICATION NO. | : 17/496790 | |
| DATED | : September 12, 2023 | |
| INVENTOR(S) | : Gangil Byun et al. | |

It is certified that error appears in the above-identified patent and that said Letters Patent is hereby corrected as shown below:

On the Title Page

UNIST(ULSAN NATIONAL INSTITUTE OF SCIENCE AND TECHNOLOGY), Ulsan(KR) should be added in the "(73) Assignee" section Signed and Sealed this
Seventeenth Day of October, 2023

Katherine Kelly Vidal
*Director of the United States Patent and Trademark Office*